US007884422B2

(12) United States Patent
Mizukami et al.

(10) Patent No.: US 7,884,422 B2
(45) Date of Patent: Feb. 8, 2011

(54) SEMICONDUCTOR MEMORY AND METHOD FOR MANUFACTURING A SEMICONDUCTOR MEMORY

(75) Inventors: Makoto Mizukami, Kawasaki (JP); Riichiro Shirota, Fujisawa (JP); Fumitaka Arai, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 632 days.

(21) Appl. No.: 11/841,257

(22) Filed: Aug. 20, 2007

(65) Prior Publication Data
US 2008/0073695 A1 Mar. 27, 2008

(30) Foreign Application Priority Data
Aug. 23, 2006 (JP) ............... P2006-226741

(51) Int. Cl.
H01L 27/12 (2006.01)
(52) U.S. Cl. .............. 257/347; 257/314; 257/315; 257/E27.112; 257/E21.332; 257/E21.545
(58) Field of Classification Search ......... 257/347, 257/E27.112, E21.32, E21.545; 438/311, 438/314, 315
See application file for complete search history.

(56) References Cited

U.S. PATENT DOCUMENTS

| 6,881,621 | B2 | 4/2005 | Choe et al. | |
|---|---|---|---|---|
| 2002/0047169 | A1 | 4/2002 | Kunikiyo | |
| 2005/0101072 | A1* | 5/2005 | Bryant et al. | 438/151 |
| 2005/0199938 | A1* | 9/2005 | Sakuma et al. | 257/314 |
| 2006/0049449 | A1 | 3/2006 | Iino et al. | |
| 2006/0237706 | A1 | 10/2006 | Enda et al. | |
| 2006/0245251 | A1 | 11/2006 | Shirota et al. | |
| 2007/0102749 | A1 | 5/2007 | Shirota et al. | |

| 2007/0128815 | A1 | 6/2007 | Iino et al. |

FOREIGN PATENT DOCUMENTS

| CN | 1340862 A | 3/2002 |
|---|---|---|
| JP | 7-211917 | 8/1995 |
| JP | 7-288328 | 10/1995 |
| JP | 8-274337 | 10/1996 |
| JP | 9-55363 | 2/1997 |

(Continued)

OTHER PUBLICATIONS

U.S. Appl. No. 11/947,008, filed Nov. 29, 2007, Nishihara, et al.

(Continued)

*Primary Examiner*—Zandra Smith
*Assistant Examiner*—Paul E Patton
(74) *Attorney, Agent, or Firm*—Oblon, Spivak, McClelland, Maier & Neustadt, L.L.P.

(57) ABSTRACT

A semiconductor memory including a plurality of cell units arranged in a row direction, each of the cell units includes: a semiconductor region; a first buried insulating film provided on the semiconductor region; a second buried insulating film provided on the first buried insulating film, which has higher dielectric constant than the first buried insulating film; a semiconductor layer provided on the second buried insulating film; and a plurality of memory cell transistors arranged in a column direction, each of the memory cell transistors having a source region, a drain region and a channel region defined in the semiconductor layer.

6 Claims, 35 Drawing Sheets

FOREIGN PATENT DOCUMENTS

| | | |
|---|---|---|
| JP | 11-163303 | 6/1999 |
| JP | 2001-518711 | 10/2001 |
| JP | 2002-76336 | 3/2002 |
| JP | 2002-190460 | 7/2002 |
| JP | 2003-152192 | 5/2003 |
| JP | 2004-281782 | 10/2004 |
| JP | 2006-73939 | 3/2006 |
| KR | 2002-0018549 | 3/2002 |

OTHER PUBLICATIONS

U.S. Appl. No. 11/963,046, filed Dec. 21, 2007, Arai, et al.
U.S. Appl. No. 12/167,695, filed Jul. 3, 2008, Mizushima, et al.

* cited by examiner

SEMICONDUCTOR MEMORY AND METHOD FOR MANUFACTURING A SEMICONDUCTOR MEMORY

CROSS REFERENCE TO RELATED APPLICATIONS AND INCORPORATED BY REFERENCE

The application is based upon and claims the benefit of priority from the prior Japanese Patent Applications No. P2006-226741, filed on Aug. 23, 2006; the entire contents of which are incorporated herein by reference.

BACKGROUND OF THE INVENTION

1. Field of the Invention

This present invention relates to a Silicon on Insulator (SOI) architecture, more particularly, to a semiconductor memory and a method for manufacturing the same using the SOI architecture.

2. Description of the Related Art

As one type of semiconductor memories, a nonvolatile semiconductor memory that employs a partial SOI substrate is known. When the partial SOI substrate is formed, first, a buried insulating film (BOX film) made of silicon oxide ($SiO_2$) is deposited on a semiconductor substrate, and window portions are formed in a part of the buried insulating film. Thereafter, a semiconductor layer (SOI layer) is deposited on the semiconductor substrate exposed to the window portions and on the buried insulating film.

It is a problem here that, when the semiconductor layer is deposited, step differences corresponding to a thickness of the buried insulating film are formed on boundary portions between the window portions and the buried insulating film. Such step differences of the semiconductor layer cause variations in exposure and variations in process, sometimes resulting in a deterioration of characteristics of transistors formed on the semiconductor layer.

As one of method for solving this problem, after the window portions are formed in the buried insulating film, and the semiconductor layer is deposited thereon, chemical mechanical polishing (CMP) is performed by using the buried insulating film as a stopper, and a surface of the semiconductor layer is thereby planarized. Thereafter, the semiconductor layer is deposited one more time on the buried insulating film and the planarized semiconductor layer. In such a way, planarity of the surface of the semiconductor layer is maintained.

However, in some cases, defects are introduced into the buried insulating film used as the stopper by the mechanical impact of the CMP process, that is, by scratches and a stress, which are caused during the polishing. The defects undesirably exist in a carrier path between a source/drain direction of each transistor formed on the semiconductor layer, and deteriorate turn-off characteristics of each transistor. Moreover, there is a problem that the introduced defects increase other defects in a vertical direction of the buried insulating film, and form a leakage path from each channel region of the transistors to the semiconductor substrate, thereby causing a deterioration of a breakdown voltage.

SUMMARY OF THE INVENTION

An object of the present invention is to provide a nonvolatile semiconductor memory and a method for manufacturing thereof, which can suppress deteriorations of turn-off characteristics and breakdown voltage of memory cell transistors.

An aspect of the present invention inheres in a semiconductor memory including a plurality of cell units arranged in a row direction, each of the cell units including: a semiconductor region; a first buried insulating film provided on the semiconductor region; a second buried insulating film provided on the first buried insulating film, which has higher dielectric constant than the first buried insulating film; a semiconductor layer provided on the second buried insulating film; and a plurality of memory cell transistors arranged in a column direction, each of the memory cell transistors having a source region, a drain region and a channel region defined in the semiconductor layer.

Another aspect of the present invention inheres in a method for manufacturing a semiconductor memory including: forming a first buried insulating film on a semiconductor substrate; forming a second buried insulating film, which is different material from the first buried insulating film, on the first buried insulating film; exposing a part of a surface of the semiconductor substrate by removing a part of the first and second buried insulating films; burying a first semiconductor layer on the exposed part of the semiconductor substrate so that a horizontal level of the surface of the first semiconductor layer coincides with a horizontal level of a surface of the second buried insulating film; depositing a second semiconductor layer on the first semiconductor layer and the second buried insulating film; depositing a first insulating layer on the second semiconductor layer; depositing an electric charge storage layer on the first insulating layer; depositing a second insulating layer on the electric charge storage layer; depositing a gate electrode layer on the second insulating layer; and forming source and drain regions of memory cell transistors so as to implement a cell unit by an arrangement of the memory cell transistors in the second semiconductor layer.

Further aspect of the present invention inheres in a method for manufacturing a semiconductor memory including: forming a first buried insulating film on a semiconductor substrate; forming a second buried insulating film, which is formed of a material different from the first buried insulating film, on the first buried insulating film; exposing a part of a surface of the semiconductor substrate by removing a part of the first and second buried insulating films; burying a first semiconductor layer on the exposed part of the semiconductor substrate so that a horizontal level of a surface of the first semiconductor layer coincides with a horizontal level of a surface of the second buried insulating film; removing entirely the second buried insulating film; depositing a second semiconductor layer on the first semiconductor layer and the first buried insulating film; depositing a first insulating layer on the second semiconductor layer; depositing an electric charge storage layer on the first insulating layer; depositing a second insulating layer on the electric charge storage layer; depositing a gate electrode layer on the second insulating layer; and forming source and drain regions of memory cell transistors so as to implement a cell unit by an arrangement of the memory cell transistors in the second semiconductor layer.

DETAILED DESCRIPTION OF THE INVENTION

Figure 1:
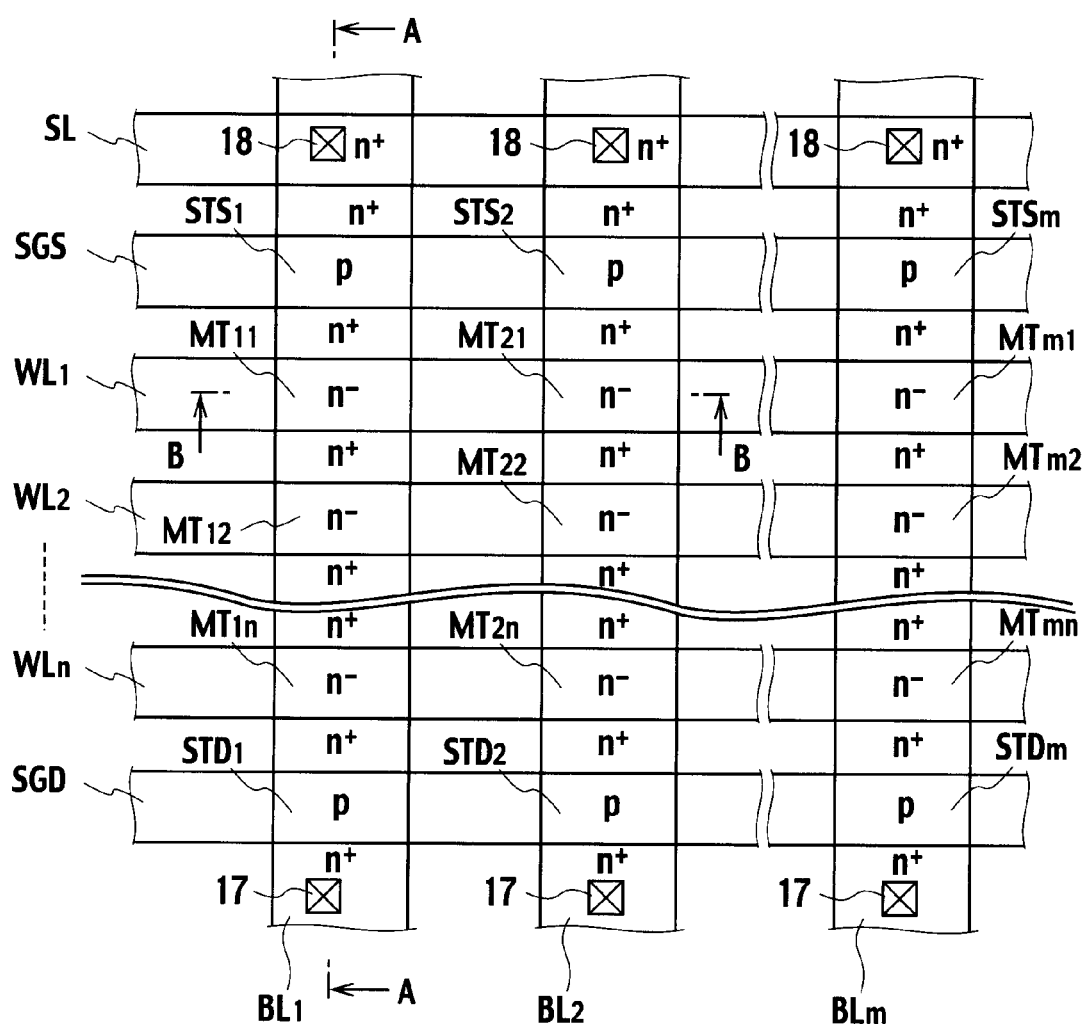
FIG. 1 is a plan view showing an example of a semiconductor memory according to an embodiment of the present invention.

An embodiment and various modifications of the present invention will be described with reference to the accompanying drawings. It is to be noted that the same or similar reference numerals are applied to the same or similar parts and elements throughout the drawings, and the description of the same or similar parts and elements will be omitted or simplified.

Generally and as it is conventional in the representation of semiconductor devices, it will be appreciated that the various drawings are not drawn to scale from one figure to another nor inside a given figure, and in particular that the layer thicknesses are arbitrarily drawn for facilitating the reading of the drawings.

In the embodiment of the present invention, the conductivity type of the "first conductivity type" and "second conductivity type" are mutual opposites. In other words, when the first conductivity type is an n-type then the second conductivity type will be a p-type, and vice versa. Below, a case with the first conductivity type as a p-type and the second conductivity type as an n-type will be described. However, another case with the first conductivity type as an n-type and the second conductivity type as a p-type is also contemplated. When n-type and p-type conductivities are changed to the opposite type, polarizations of applied voltages are also oppositely changed.

As shown in FIG. 1, a semiconductor memory according to the embodiment of the present invention is a NAND flash EEPROM in which a plurality of memory cell transistors $MT_{11}$ to $MT_{mn}$ are arranged in a matrix, implementing a cell array. FIG. 1 shows the m×n ("m" and "n" are integers) cell array in which a plurality of memory cell transistors $MT_{11}$ to $MT_{1n}$, $MT_{21}$ to $MT_{2n}$, $MT_{31}$ to $MT_{3n}$, ..., $MT_{m1}$ to $MT_{mn}$ are arranged in the matrix, as an example. As shown in FIG. 1, a source line SL connected to source line contact plugs 18; a select gate line SGS connected to select gate electrodes of select gate transistors $STS_1$, $STS_2$, $STS_3$, ..., $STS_m$; a word line $WL_1$ connected to control gate electrodes of the respective memory cell transistors $MT_{11}$ to $MT_{m1}$; a word line $WL_2$ connected to control gate electrodes of the respective memory cell transistors $MT_{12}$ to $MT_{m2}$, ..., a word line $WL_n$ connected to control gate electrodes of the respective memory cell transistors $MT_{1n}$ to $MT_{mn}$; and a select gate line SGD connected to select gate electrodes of select gate transistors $STD_1$, $STD_2$, $STD_3$, ..., $STD_m$ are arranged in the column direction of the cell array. A plurality of bit lines $BL_1$, $BL_2$, $BL_3$, ..., $BL_m$, connected to bit line contact plugs 17, are arranged in the row direction, extend in the column direction.

FIG. 1 representatively shows a cell unit encompassing a plurality of memory cell transistors $MT_{11}$ to $MT_{1n}$, another cell unit encompassing a plurality of memory cell transistors $MT_{21}$ to $MT_{2n}$, and a still another cell unit encompassing a plurality of memory cell transistors $MT_{m1}$ to $MT_{mn}$, which extend in the column direction. However, a plurality of cell units similar to the cell units shown by the memory cell transistors $MT_{11}$ to $MT_{1n}$, $MT_{21}$ to $MT_{2n}$, ..., $MT_{m1}$ to $MT_{mn}$ may be extend in the column direction.

Figure 2:
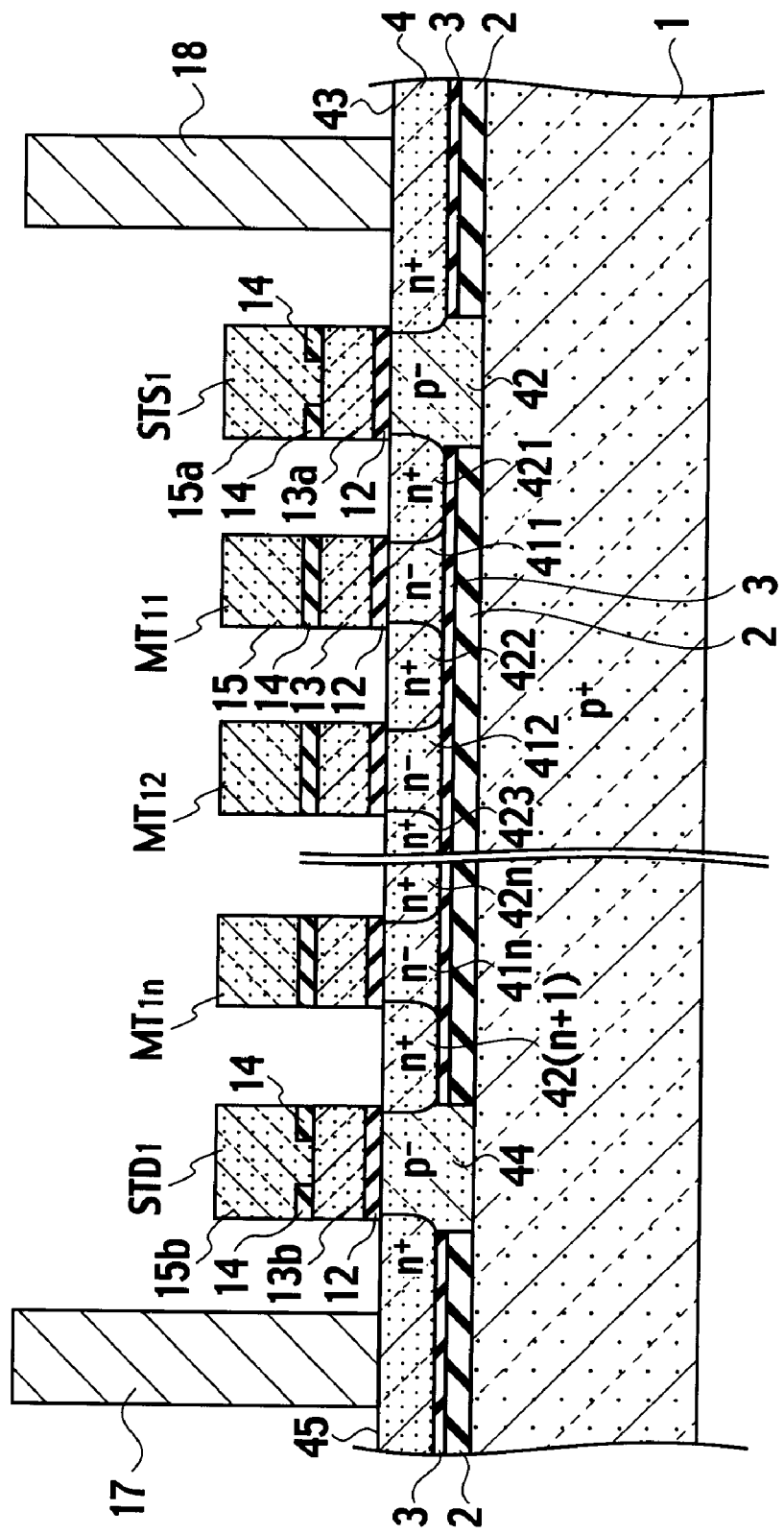
FIG. 2 is a cross-sectional view in a column direction showing the semiconductor memory.

FIG. 2 is a cross sectional view taken along the A-A line in the column direction shown in FIG. 1. As shown in FIG. 2, the semiconductor memory includes: a semiconductor substrate 1 having $p^+$-type conductivity; a first buried insulating film (BOX layer) 2 provided on the semiconductor substrate 1; a second buried insulating film (BOX layer) 3 provided on the first buried insulating film 2; and a semiconductor layer (SOI layer) 4 provided on the second buried insulating film 3. The second buried insulating film (BOX layer) 3 has a higher dielectric constant than the first buried insulating film 2. Source regions 421, 422, ..., 42n having $n^+$-type conductivity, drain regions 422, 423, ..., 42(n+1) having $n^+$-type conductivity, and channel regions 411, 412, ..., 41n having n-type conductivity of each of the plurality of the memory cell transistors $MT_{11}$ to $MT_{1n}$ are periodically defined in the semiconductor layer 4, so as to correspond to arrangements of the plurality of memory cell transistors $MT_{11}$ to $MT_{1n}$.

Note that, a well region (p-well) having p-type conductivity may be provided in the semiconductor substrate, which has n-type conductivity, instead of the semiconductor substrate 1 having $p^+$-type conductivity.

The thickness of the first buried insulating film 2 is approximately 10 to 40 nm. A $SiO_2$ film and the like can be used as a material for the first buried insulating film 2. The thickness of the second buried insulating film 3 is approximately 5 to 10 nm, which is thinner than the first buried insulating film 2. A high-k material such as silicon nitride ($Si_3N_4$), silicon oxide nitride (SiON), alumina ($Al_2O_3$) or the like, which has a higher dielectric constant than the first buried insulating film 2, can be used as materials for the second buried insulating film 3. Si, Silicon germanium (SiGe), silicon carbide (3C—SiC) or the like can be used as materials for the semiconductor layer 4.

Each of the memory cell transistors $MT_{11}$ to $MT_{1n}$, the arrangement of which implement the cell unit, includes a stacked gate structure in which floating gate electrodes (electric charge storage layers) 13 and control gate electrodes 15 are stacked. For example, the memory cell transistor $MT_{11}$ includes: the source and drain regions 421 and 422, having $n^+$-type conductivity, defined in the semiconductor layer 4; the channel regions 411 having $n^-$-type conductivity, defined in the semiconductor layer 4 so as to be interposed between the source and drain regions 421 and 422; the floating gate electrode 13 insulated from and provided on the channel regions 411; and the control gate electrode 15 insulated from and provided on the floating gate electrode 13. The memory cell transistor $MT_{12}$ includes: the source and drain regions 422 and 423, having $n^+$-type conductivity, defined in the semiconductor layer 4; the channel regions 412, having $n^-$-type conductivity, defined in the semiconductor layer 4 so as to be interposed between the source and drain regions 422 and 423; the floating gate electrode 13 insulated from and provided on the channel regions 412; and the control gate electrode 15 insulated from and provided on the floating gate electrode 13. The memory cell transistor $MT_{1n}$ includes: the source and drain regions $42n$ and $42(n+1)$, having $n^+$-type conductivity, defined in the semiconductor layer 4; the channel regions $41n$, having $n^-$-type conductivity, defined in the semiconductor layer 4 so as to be interposed between the source and drain regions $42n$ and $42(n+1)$; the floating gate electrode 13 insulated from and provided on the channel regions $41n$; and the control gate electrode 15 insulated from and provided on the floating gate electrode 13.

The thickness of the gate insulating film 12 is approximately one to twenty nm, and the thickness of the gate insulating film 12 is preferably approximately five to ten nm. In addition, silicon oxide ($SiO_2$), silicon nitride ($Si_3N_4$), tantalum oxide ($Ta_2O_5$), titanium oxide ($TiO_2$), alumina ($Al_2O_3$), zirconium oxide ($ZrO_2$) and the like can be used as a material for the gate insulating film 12.

The thickness of the inter-electrode insulating films 14 is approximately twice to approximately five times the thickness of the gate insulating film 12, and the thickness of the inter-electrode insulating films 14 is preferably approximately ten to approximately thirty nm. $Si_3N_4$, $Ta_2O_5$, $TiO_2$, $Al_2O_3$, $ZrO_2$, oxide/nitride/oxide (ONO), phosphor silicate glass (PSG), boron phosphor silicate glass (BPSG), silicon oxide nitride (SiON), barium titanate ($BaTiO_3$), silicon oxide fluoride ($SiO_xF_y$), and organic resins, such as polyimide, can be used as materials for the inter-electrode insulating films 14. Furthermore, it is possible to adapt a stacked structure to combine these materials.

Each of the source and drain regions 421 to $42(n+1)$ are shared by two of memory cell transistors in the memory cell transistors $MT_{11}$ to $MT_{1n}$, the two of memory cell transistors are adjacent to each other in the column direction. "Shared region" refers to a common region which functions in a way such that a source region for a subject memory cell transistor serves as a drain region for another memory cell transistor adjacent to the subject memory cell transistor. For example, the drain region 422 of one memory cell transistor $MT_{11}$ serves as the source region 422 of another memory cell transistor $MT_{12}$, adjacent to the memory cell transistor $MT_{11}$. The memory cell transistors $MT_{11}$ to $MT_{1n}$ implementing the cell unit are arranged such that the source regions 421 to $42n$, the channel regions 411 to $41n$ and the drain regions 422 to $42(n+1)$ are isolated from the adjacent source regions, the adjacent channel regions and the adjacent drain regions of the memory cell transistors $M_{21}$ to $M_{2n}$, which are arranged in next column.

Each of two select gate transistors $STS_1$ and $STD_1$ is arranged in, and neighboring to, each end of the column direction of a unit arrangement of the memory cell transistors $MT_{11}$ to $MT_{1n}$. The select gate transistor $STS_1$ is an enhancement MIS transistor including: a $n^+$-type drain region 421 which is common to a source region 421 of the memory cell transistor $MT_{11}$ positioned at one end of the unit arrangement of the memory cell transistors $MT_{11}$ to $MT_{1n}$ in the column direction; a p-type channel region 42 arranged so as to be adjacent to the drain region 421; a $n^+$-type source region 43 arranged so as to be adjacent to the channel region 42; and select gate electrodes 13a and 15a arranged above the channel region 42 with the gate insulating film 12 interposed between the channel region 42 and the set of select gate electrodes 13a and 15a. The drain region 421, the channel region 42 and the source region 43 are arranged in the semiconductor layer 4. A source line contact plug 18 is arranged on the source region 43 so that the source line contact plug 18 is adjacent to the select gate transistor $STS_1$.

Alternatively, the select gate transistor $STD_1$ is an enhancement MIS transistor including: a $n^+$-type source region $42(n+1)$ which is common to a drain region 42 $(n+1)$ of the memory cell transistor $MT_{1n}$ positioned at another end of the unit arrangement of the memory cell transistors $MT_{11}$ to $MT_{1n}$ in the column direction; a p-type channel region 44 arranged so as to be adjacent to the source region 42 $(n+1)$; a $n^+$-type drain region 45 arranged so as to be adjacent to the channel region 44; select gate electrodes 13b and 15b arranged above the channel region 44 with the gate insulating film 12 interposed between the channel region 44 and the set of select gate electrodes 13b and 15b. The source region 42 $(n+1)$, the channel region 44 and the drain region 45 are arranged in the semiconductor layer 4. A bit line contact plug 17 is arranged on the drain region 45 so that the bit line contact plug 17 is adjacent to the select gate transistor $STD_1$.

Figure 3:
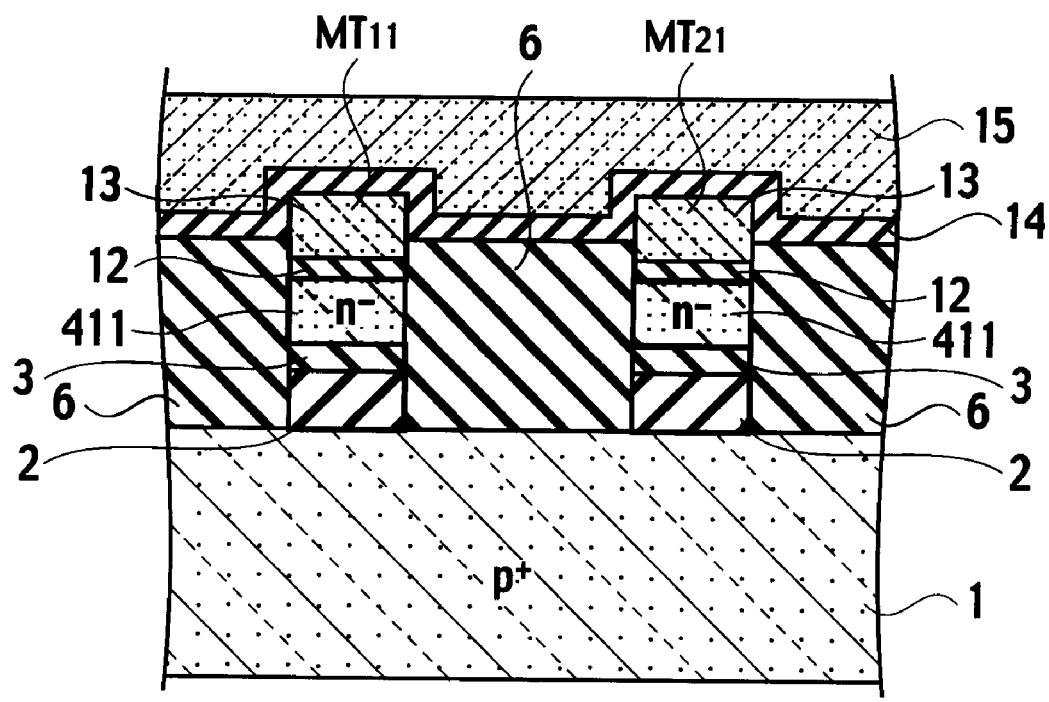
FIG. 3 is a cross-sectional view in a row direction showing the semiconductor memory.

FIG. 3 is a cross-sectional view of the semiconductor memory taken along the B-B line in the row direction shown in FIG. 1. As shown in FIG. 3, one of element isolation insulating films 6 is buried between two of the floating gate electrodes 13 and two of the channel regions 411, which are assigned to two of the memory cell transistors $MT_{11}$ and $MT_{21}$ being adjacent to one another in the row direction. Elements of the respective memory cell transistors $MT_{11}$ and $MT_{21}$, which are adjacent to one another in the row direction, are completely isolated from one another by the element isolation insulating film 6.

A peripheral circuit of a cell array is further provided on the semiconductor substrate 1 at an area outside of the cell array encompassing the memory cell transistors $MT_{11}$ to $MT_{mn}$.

Figure 4:
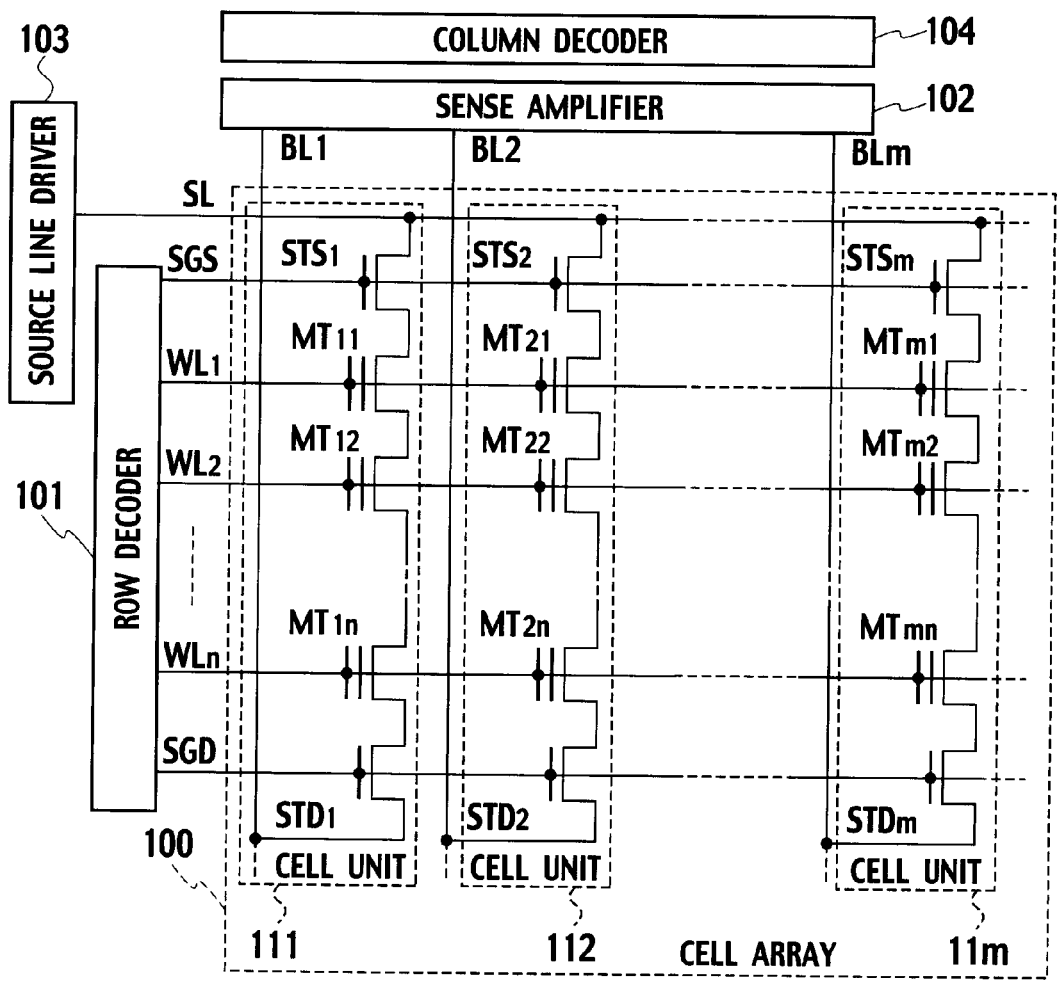
FIG. 4 is an equivalent circuit diagram of the semiconductor memory.

An equivalent circuit of the semiconductor memory according to the embodiment shown in FIGS. 1 to 3 is shown in FIG. 4. As shown in FIG. 4, a cell array 100 encompasses memory cell transistors $MT_{11}$ to $MT_{1n}$, $MT_{21}$ to $MT_{2n}$, ..., $MT_{m1}$ to $MT_{mn}$. In cell array 100, the memory cell transistors $MT_{11}$ to $MT_{1n}$, and the select gate transistors $STS_1$ and $STD_2$ are connected in series, thereby implementing a cell unit 111. The select gate transistors $STS_2$ to $STS_m$, the memory cell transistors $MT_{21}$ to $MT_{2n}$, ..., $MT_{m1}$ to $MT_{mn}$, and the select gate transistors $STD_2$ to $STD_m$ are connected in series, thereby implementing cell units 112, ..., 11m. The cell units 111, 112, ..., 11m are respectively arranged in turn in the row direction so as to form a matrix.

In the cell unit 111, the memory cell transistors $MT_{11}$ to $MT_{1n}$, and the select gate transistors $STS_1$ and $STD_1$ are connected in series. In the cell unit 112, the select gate transistor $STS_2$, the memory cell transistors $MT_{21}$ to $MT_{2n}$, and the select gate transistor $STD_2$ are connected in series. In the cell unit 11m, the select gate transistor $STS_m$, the memory cell transistors $MT_{m1}$ to $MT_{mn}$, and the select gate transistor $STD_m$ are connected in series.

In the cell unit 111, the drain region 421 of the select gate transistor $STS_1$ is connected to the source region 421 of the memory cell transistor $MT_{11}$ positioned at one end of the unit arrangement in which the group of memory cell transistors $MT_{11}$ to $MT_{1n}$ are connected in series. On the other hand, the source region $42(n+1)$ of the select gate transistor $STD_1$ is connected to the drain region $42(n+1)$ of the memory cell transistor $MT_{1n}$ positioned at the other end of the unit arrangement in which the group of memory cell transistors $MT_{11}$ to $MT_{1n}$ are connected in series. Components of the cell units 112, 113, ..., 11m are the same as that of the cell unit 111.

The source regions of the respective select gate transistors $STS_1$ to $STS_m$ are connected with a source line SL common to the source regions. A source line driver 103, which supplies voltage to the source line SL, is connected to the source line SL. The following elements are connected to a row decoder 101: a select gate line SGS common to the select gate transistors $STS_1$ to $STS_m$; a select gate line SGD common to the select gate transistors $STD_1$ to $STD_m$; a word line $WL_1$ common to the memory cell transistors $MT_{11}, MT_{21}, \ldots, MT_{m1}$; a word line $WL_2$ common the memory cell transistors $MT_{12}, MT_{22}, \ldots, MT_{m2}; \ldots$; and a word line $WL_n$ common to the memory cell transistors $MT_{1n}, MT_{2n}, \ldots, MT_{mn}$. The row decoder 101 obtains a row address decoded signal by decoding a row address signal, and supplies operation voltage to the word lines $WL_1$ to $WL_m$ and the select gate lines SGS and SGD, in a selective manner. Each of the bit lines $BL_1$ to $BL_m$ is connected to the drain region of each of the select gate transistors $STD_1$ to $STD_m$.

A sense amplifier 102 and a column decoder 104 are connected to the bit lines $BL_1$ to $BL_m$. The column decoder 104 obtains a column address decoded signal by decoding a column address signal, and selects one of the bit lines $BL_1$ to $BL_m$ based on the column address decoded signal. The sense amplifier 102 amplifies memory signals, which have been read from a memory cell transistor selected by the row decoder 101 and the column decoder 104.

Figure 5:
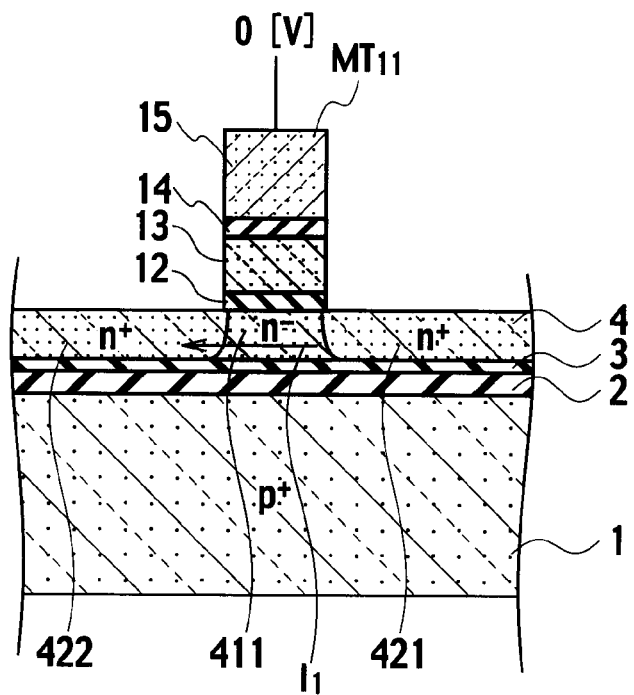
FIGS. 5 to 7 are cross-sectional views showing a memory cell transistor for explaining reading operation of the semiconductor memory.

Next, a description will be provided for an example of a reading operation of the semiconductor memory according to the embodiment of the present invention. 0V is applied to the control gate electrode 15 of the memory cell transistors (for example, the memory cell transistors $MT_{11}$) for reading. In a case where electrons have not been accumulated in the floating gate electrode 13 as shown in FIG. 5, the selected memory cell transistor $MT_{11}$ is in the "on" state, and accordingly channel current $I_1$ flows. At this time, it is determined that the selected memory cell transistor $MT_{11}$ is in the "erase" state (data is "1").

Figure 6:
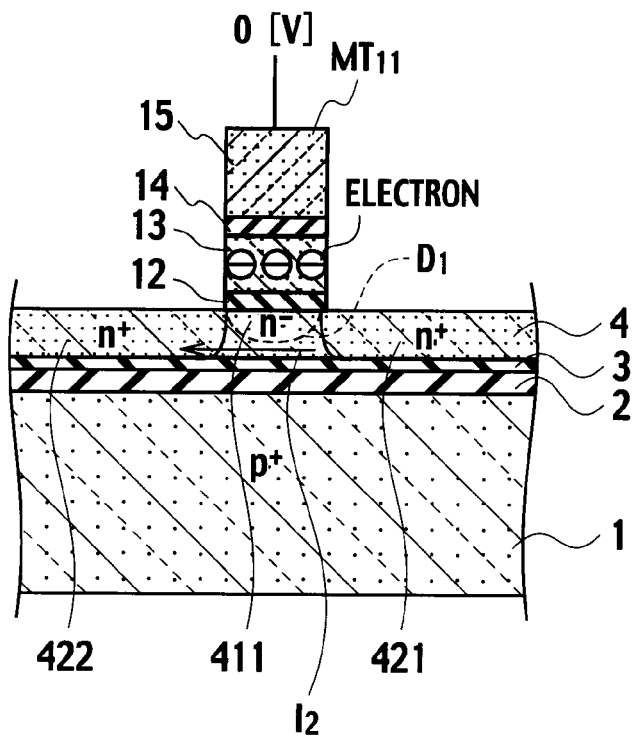

On the other hand, when electrons have accumulated in the floating gate electrode 13 as shown in FIG. 6, a depletion layer $D_1$ of the channel region 411 underneath the floating gate electrode 13 increases. Accordingly, the memory cell transistor $MT_{11}$ is in the "off" state. Thus, the channel current does not flow. At this time, it is determined that the selected memory cell transistor $MT_{11}$ is in the "write" state (data is "0").

Here, as shown in FIG. 6, when the depletion layer $D_1$ does not increase to the second buried insulating film 3, there is a possibility that a carrier path $I_2$ may be formed in the vicinity of an interface of the channel region 411 with the second buried insulating film 3, thereby causing an erroneous read of the data.

In order to prevent this erroneous read, back gate control is performed. In order to perform the back gate control, back gate plugs having the same pattern as that of the source line contact plugs 18 are formed in a plural of areas in the cell array while using, as a back gate, the entire surface of the semiconductor substrate 1 (or the p-type well region), or at least the semiconductor substrate 1 (or the p-type well region) under the memory cell transistors $MT_{11}$ to $MT_{1n}$, $MT_{21}$ to $MT_{2n} \ldots$, and $MT_{m1}$ to $MT_{mn}$. While the source line contact plugs 18 are grounded, the back gate contact plugs are connected to a back gate control circuit 105 shown in FIG. 7.

Figure 7:
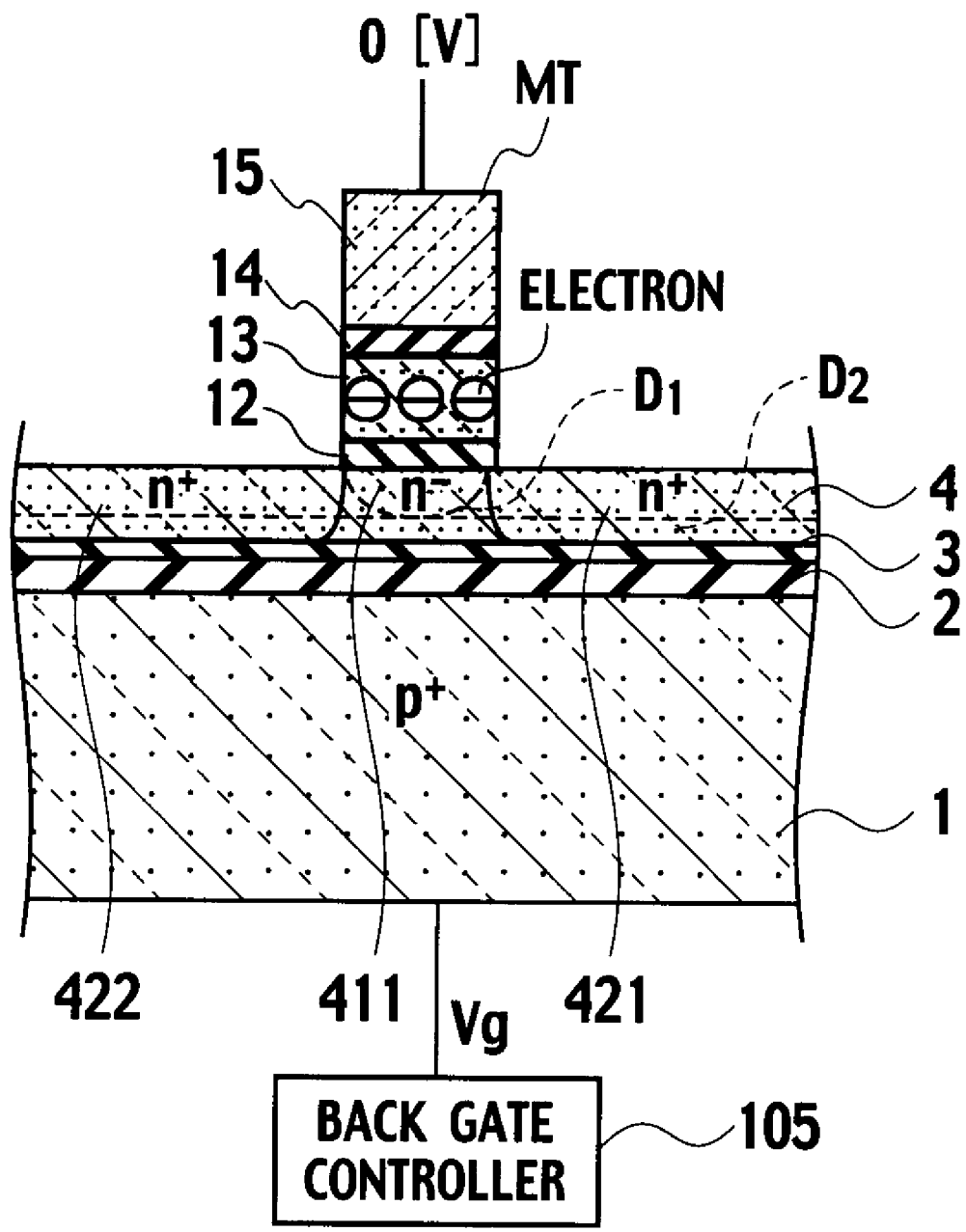

As shown in FIG. 7, when the memory cell transistor $MT_{11}$ that reads the data is turned off, a voltage $V_g$ is applied to the semiconductor substrate (back gate) 1 by using the back gate control circuit 105. In such a way, electrons captured in the second buried insulating film 3 are induced, and a depletion layer $D_2$ increases from the second buried insulating film 3 side to the channel region 411 side of the memory cell transistor $MT_{11}$, thus making it possible to suppress the carrier path in the vicinity of the interface with the second buried insulating film 3. As described above, by the back gate control, the turn-off characteristics of the memory cell transistor $MT_{11}$ can be enhanced.

Here, it is required that the buried insulating film have a thickness of several tens of nanometers in order to maintain the insulating property thereof. When the thickness of the buried insulating film is increased, a capacity of the semiconductor memory is decreased while an effect of suppressing a leak current is increased, and such an effect of enhancing the turn-off characteristics by the back gate is deteriorated. In accordance with the semiconductor memory according to the embodiment of the present invention, the second buried insulating film 3, in which dielectric constant is high, is used on the first buried insulating film 2. Accordingly, a desired capacity value is provided while maintaining the thickness of the buried insulating film, with which it is possible to suppress the leak current. Thus, it is possible to maintain the effect of enhancing the turn-off characteristics.

Moreover, in a write operation of the semiconductor memory according to the embodiment of the present invention, a write voltage $V_{pp}$ (for example, approximately 20V) is applied to the control gate of the memory cell transistor (for example, memory cell transistor $MT_{11}$) that writes the data, and a difference between a potential of the semiconductor substrate 1 and a potential of the control gate electrode 15 is increased, whereby a tunnel current is injected into the floating gate. At this time, there is a possibility that the following problem may occur. Specifically, the write voltage $V_{pp}$ may be simultaneously applied also to the memory cell transistor (for example, memory cell transistor $MT_{21}$) that is adjacent to the memory cell transistor $MT_{11}$ in the row direction and does not write the data. The tunnel current may be injected also to the memory cell transistor $MT_{21}$, and the data may be erroneously written therein. In order to suppress such erroneous write operation, a self-boost operation is performed.

A description will be made of the self-boost operation by using FIG. 4. First, the selection gate line SGD on the bit lines $BL_1, BL_2 \ldots$ and $BL_m$ side is turned on. Potentials of the bit lines $BL_2 \ldots$, and $BL_m$ connected to NAND columns $MT_{21}$ to $MT_{2n} \ldots$, and $MT_{m1}$ to $MT_{mn}$ which do not write the data are raised to $V_{pass}$. Meanwhile, a potential of the bit line $BL_1$ connected to a NAND column $MT_{11}$ to $MT_{1n}$ including the memory cell transistor $MT_{11}$ that writes the data is maintained at 0V. Then, potentials of the control gate electrodes which do not write the data are raised to the potential $V_{pass}$. In such a way, the memory cell transistors $MT_{12}$ to $MT_{1n}$, $MT_{22}$ to $MT_{2n} \ldots$, and $MT_{m2}$ to $MT_{mn}$ are turned on, and biases applied to the bit lines $BL_1, BL_2 \ldots$, and $BL_m$ are transferred thereto. As a result, in the NAND arrangement $MT_{21}$ to $MT_{2N} \ldots$, and $MT_{m1}$ to $MT_{mn}$ which do not write the data, a potential of the surface of the semiconductor substrate 1 approaches the voltage $V_{pass}$, and in the NAND column $MT_{11}$ to $MT_{1n}$ that writes the data, a potential of the surface of the semiconductor substrate 1 is maintained at 0V. Thereafter, the write voltage $V_{pp}$ is applied to the control gate of the memory cell transistor $MT_{11}$ that writes the data. In such a way, a potential difference in the memory cell transistor $MT_{21}$ that does not write the data and is adjacent to the memory cell transistor $MT_{11}$ writing the data becomes less than a potential difference in the memory cell transistor $MT_{11}$ writing the data. Accordingly, the erroneous write operation can be suppressed.

When the above described back gate control has priority, a high-k material is suitable for the buried insulating film. However, considering the self-boost, a capacity of the buried insulating film should be small in order to efficiently transmit a bias to the channels when the bias is applied to the control gate. In this case, when only a single-layer buried insulating film made of the high-k material, such as SiN, SiON, and $Al_2O_3$, is used, it is difficult to achieve the optimum values of the physical film thickness and the leak current. In accordance with the semiconductor memory device according to the embodiment of the present invention, a stacked structure is adopted of the first buried insulating film 2 and the second buried insulating film 3 having a higher dielectric constant than the first buried insulating film 2. In such a way, a degree of freedom in optimum design considering the leak current, the back gate, and the self-boost can be enhanced.

Moreover, in particular, when the second buried insulating film 3 is a silicon nitride film (SiN film), the silicon nitride film has a far more excellent in insulating property than the $SiO_2$ film. Specifically, the $SiO_2$ film substantially prevents a current from flowing between the channels and the substrate, which would cause a dielectric breakdown even if the bias is applied thereto. However, in the case of causing the dielectric breakdown, the $SiO_2$ film causes a hard breakdown, where the current then flows all at once. Thereafter, the $SiO_2$ film does not to exhibit an insulating effect, and the leak current will flow therethrough, even if only a low voltage is applied thereto. With regard to the SiN film, a minute leak current larger than in the $SiO_2$ film flows therethrough, even if the dielectric breakdown does not occur; however, such a minute leak current that corresponds to the voltage only flows therethrough, which does not result in the dielectric breakdown, and the current does not flow all at once therethrough.

Here, in the write operation of the semiconductor memory according to the embodiment of the present invention, such a bias (approximately 8V) that causes the dielectric breakdown on the channel side (first and second buried insulating films 2, 3) is applied when the self-boost operation is performed in a state where no bias (zero bias) is applied to the substrate side (region under the first and second buried insulating films 2, 3). At this time, if the first buried insulating film ($SiO_2$ film) 2 does not cause the dielectric breakdown, then the current hardly flows between the channels and the substrate by the first buried insulating film ($SiO_2$ film) 2. Even if the first buried insulating film ($SiO_2$ film) 2 causes the dielectric breakdown, then the second buried insulating film (SiN film) 3 is present, whereby the insulating effect can be maintained, even though the minute leak current flows therethrough. Note that effects similar to the physical property of the above-described SiN film can also be applied to another second buried insulating film 3 made of the high-k material, such as SiON and $Al_2O_3$ other than SiN.

Moreover, in particular, when the second buried insulating film 3 is a silicon oxide nitride film (SiON film), the number of electron traps in the SiON film is less than the number in the SiN film. Accordingly, variations in characteristics owing to carriers captured by the second buried insulating film 3 can be suppressed.

Next, a description will be provided for an example of a method for manufacturing the semiconductor memory employing the partial SOI substrate according to the present embodiment. Here, FIGS. 8A, 9A, . . . , and 27A show cross-sectional views of the cell array, shown in FIG. 1, in the column direction taken along the A-A line. In addition, FIGS. 8B, 9B, . . . , and 27B show cross-sectional views of the cell array, in the row direction, taken along the B-B line.

Figure 8A:
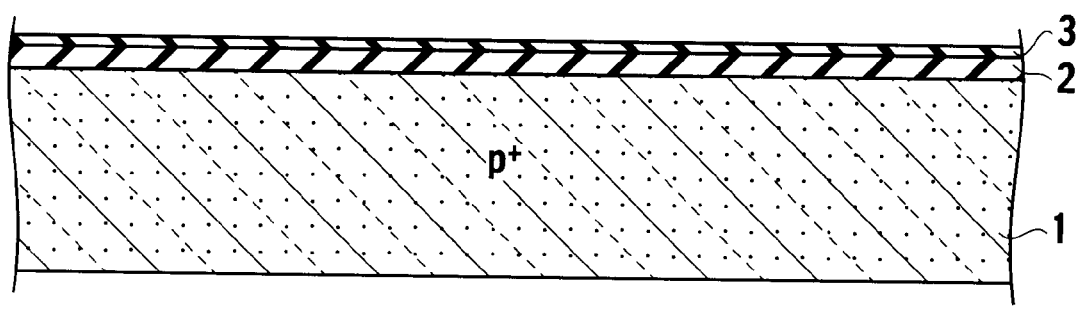
FIG. 8A is a cross-sectional view in the column direction showing an example of a method for manufacturing the semiconductor memory.
Figure 8B:
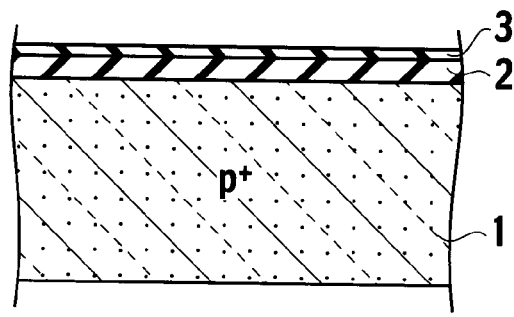
FIG. 8B is a cross-sectional view in the row direction showing the method for manufacturing the semiconductor memory.

As shown in FIGS. 8A and 8B, a p-type single crystal semiconductor substrate 1 is prepared. On the semiconductor substrate 1, the first buried insulating film 2 is deposited with a thickness of approximately 30 to 40 nm by chemical vapor deposition (CVD), thermal oxidation, or the like. Subsequently, on the first buried insulating film 2, the second buried insulating film 3, made of a material different from that of the first buried insulating film 2 is deposited with a thickness of approximately 5 to 10 nm by CVD or the like. It is preferable that the second buried insulating film 3 has stronger mechanical strength than the $SiO_2$ film and has resistance to chemical reaction by hydrofluoric acid (HF). As a material of the second buried insulating film 3, for example, a high-k material such as $Si_3N_4$, SiON and $Al_2O_3$, which has a higher dielectric constant than $SiO_2$, is usable. In particular, the $Al_2O_3$ film has stronger mechanical strength than the SiN film.

Figure 9A:
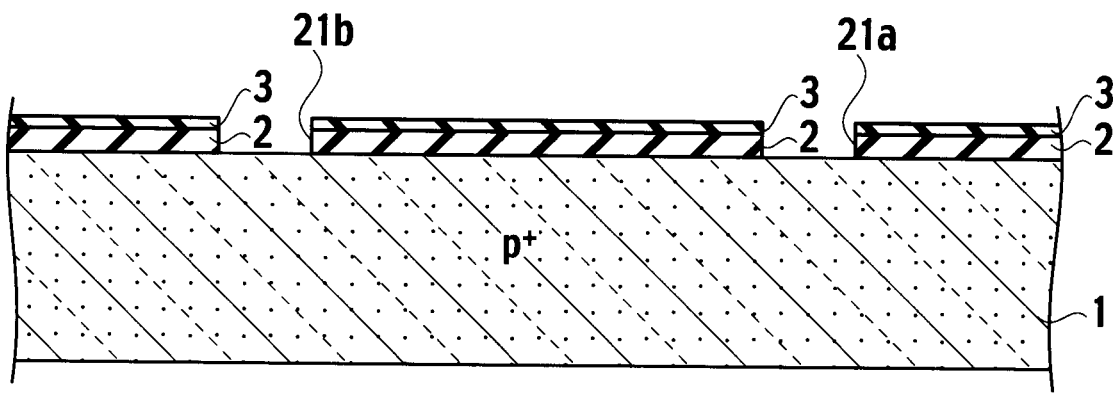
FIG. 9A is a cross-sectional view in the column direction showing the method for manufacturing the semiconductor memory.
Figure 9B:
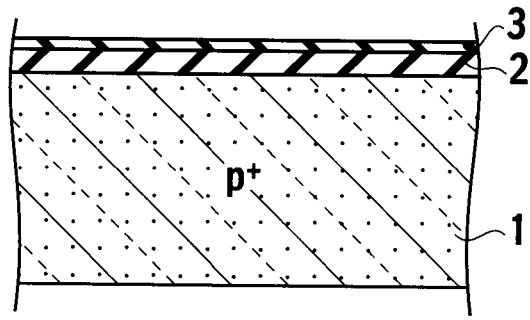
FIG. 9B is a cross-sectional view in the row direction showing the method for manufacturing the semiconductor memory.

A resist film is spin-coated on the second buried insulating film 3, and an etching mask of the resist film is formed by using photolithography technology. By reactive ion etching (RIE) using this etching mask, the first buried insulating film 2 and the second buried insulating film 3 are partially and selectively removed, and window portions 21a and 21b are formed in regions where the channel regions of the selection gate transistors are formed. Thereafter, the resist film is removed by using a resist remover or the like. As a result, as shown in FIGS. 9A and 9B, the surface of the semiconductor substrate 1 is partially exposed to bottom portions of the window portions 21a and 21b.

Figure 10A:
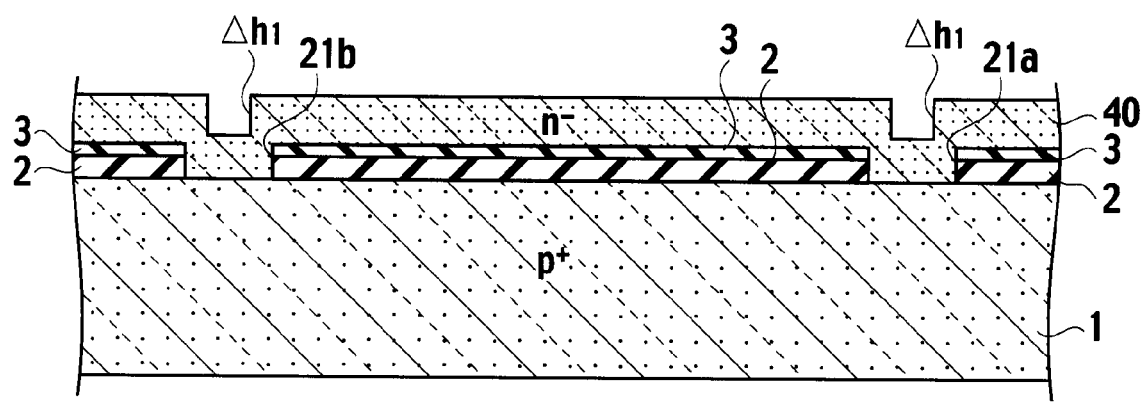
FIG. 10A is a cross-sectional view in the column direction showing the method for manufacturing the semiconductor memory.
Figure 10B:
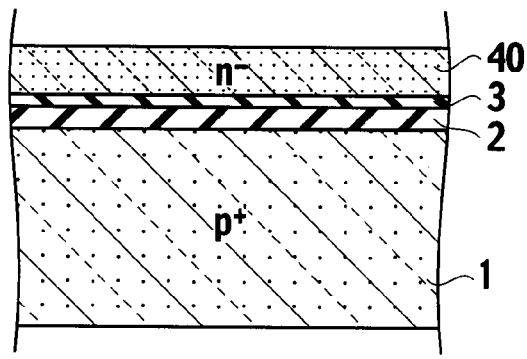
FIG. 10B is a cross-sectional view in the row direction showing the method for manufacturing the semiconductor memory.

As shown in FIGS. 10A and 10B, on the exposed surface of the semiconductor substrate 1 and the second buried insulating film 3, a semiconductor layer (first semiconductor layer) 40 made of Si or the like is deposited with a thickness of approximately 30 to 40 nm. In this case, the first crystalline semiconductor layer 40 having crystal property of the semiconductor substrate 1 is formed by, for example, selective epitaxial growth, solid-phase epitaxial growth, liquid-phase epitaxial growth, vapor-phase epitaxial growth, or the like. Alternatively, the first semiconductor layer 40, which is amorphous or polycrystal, may be formed without being epitaxially grown. Alternatively, the first semiconductor layer 40, in at least a region other than regions where the memory cell transistors are formed, may be subjected to a single crystallization process, and the first semiconductor layer 40 in the regions where the memory cell transistors are formed may be formed without distinction of its crystallographic state including the single crystal, the polycrystal, the amorphous property, and the like. At this time, on the first semiconductor layer 40 located on boundary portions between the second buried insulating film 3 and the window portions 21a and 21b, step differences Δh1 corresponding to the sum of the thickness of the first buried insulating film 2 and the thickness of the second buried insulating film 3 are formed.

Figure 11A:
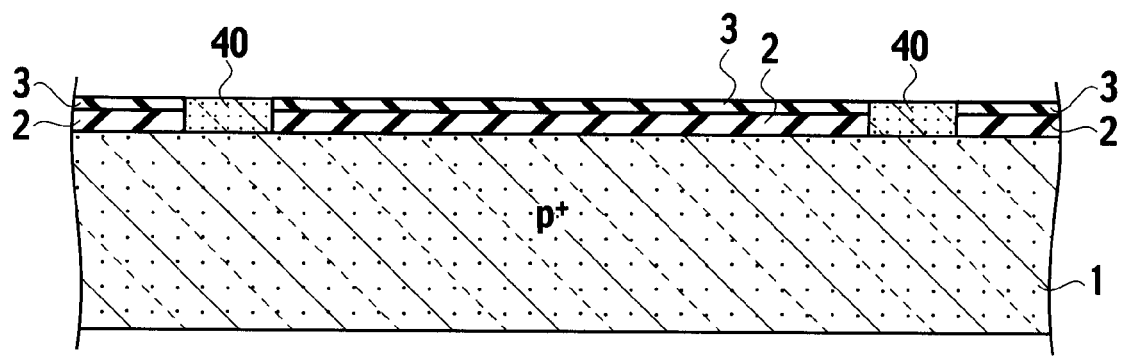
FIG. 11A is a cross-sectional view in the column direction showing the method for manufacturing the semiconductor memory.
Figure 11B:
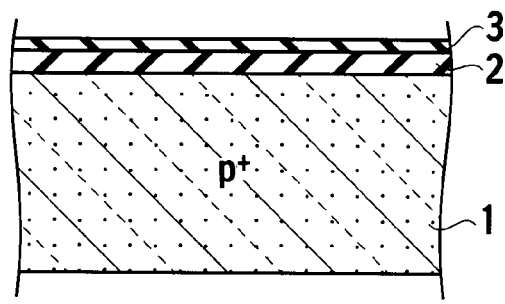
FIG. 11B is a cross-sectional view in the row direction showing the method for manufacturing the semiconductor memory.

As shown in FIGS. 11A and 11B, the first semiconductor layer 40 is planarized by chemical mechanical polishing (CMP) until the surface of the second buried insulating film 3 is exposed. At this time, since the second buried insulating film 3 is not the same or continuous with the first buried insulating film 2, even if a surface defects of the second buried insulating film 3, introduced by the mechanical impact from the CMP, propagates in a cross-sectional direction, the defects can be kept within the second buried insulating film 3 and can be suppressed from being introduced into the first buried insulating film 2. As a result of performing the CMP, a horizontal level of the surface of the first semiconductor layer 40 coincides with a horizontal level of the surface of the second buried insulating film 3.

Figure 12A:
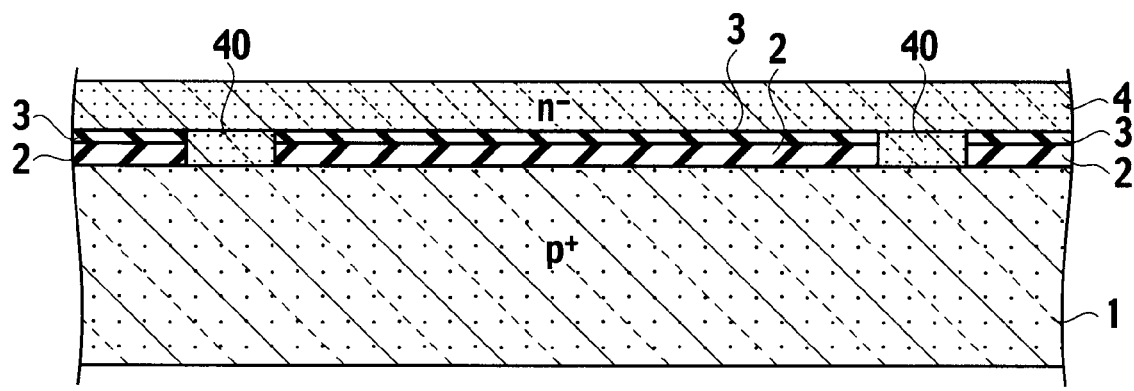
FIG. 12A is a cross-sectional view in the column direction showing the method for manufacturing the semiconductor memory.
Figure 12B:
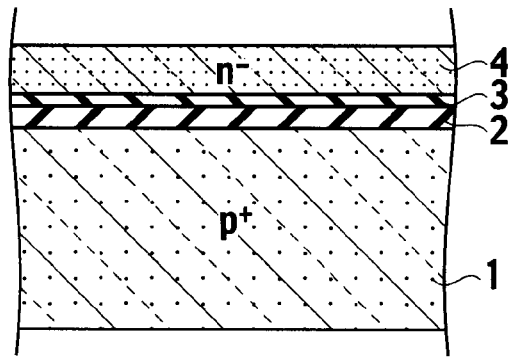
FIG. 12B is a cross-sectional view in the row direction showing the method for manufacturing the semiconductor memory.

A second semiconductor layer 4 is deposited. As pretreatment of this deposition, a natural oxidation film (not shown) formed on the first semiconductor layer 40 is removed by using an HF etching solution such as a buffered HF solution (BHF) in which ammonium fluoride ($NH_4F$) is mixed with hydrofluoric acid (HF). Here, as the second buried insulating film 3, an insulating film having resistance to an etching by HF is used, and accordingly, the first buried insulating film 2 can be protected. Then, as shown in FIGS. 12A and 12B, on the second buried insulating film 3 and the first semiconductor layer 40, the semiconductor layer (second semiconductor layer) 4 made of Si or the like is formed with a thickness of approximately 20 to 50 nm by CVD or the like. Here, since the horizontal levels of the surfaces of the first semiconductor layer 40 and the second buried insulating film 3 coincide with each other, planarity of the surface of the second semiconductor layer 4 is maintained. In this case, the crystalline second semiconductor layer 4 having crystal property of the first semiconductor layer 40 is formed by, for example, selective epitaxial growth, solid-phase epitaxial growth, liquid-phase epitaxial growth, vapor-phase epitaxial growth, or the like. Alternatively, the second semiconductor layer 4 that is amorphous or polycrystal may be formed without being epitaxially grown. Alternatively, the second semiconductor layer 4, in at least a region other than regions where the memory cell transistors are formed, may be subjected to single crystallization process, and the second semiconductor layer 4 in the regions where the memory cell transistors are formed may be formed without distinction of its crystallographic state including single crystal, polycrystal, amorphous properties, and the like.

Figure 13A:
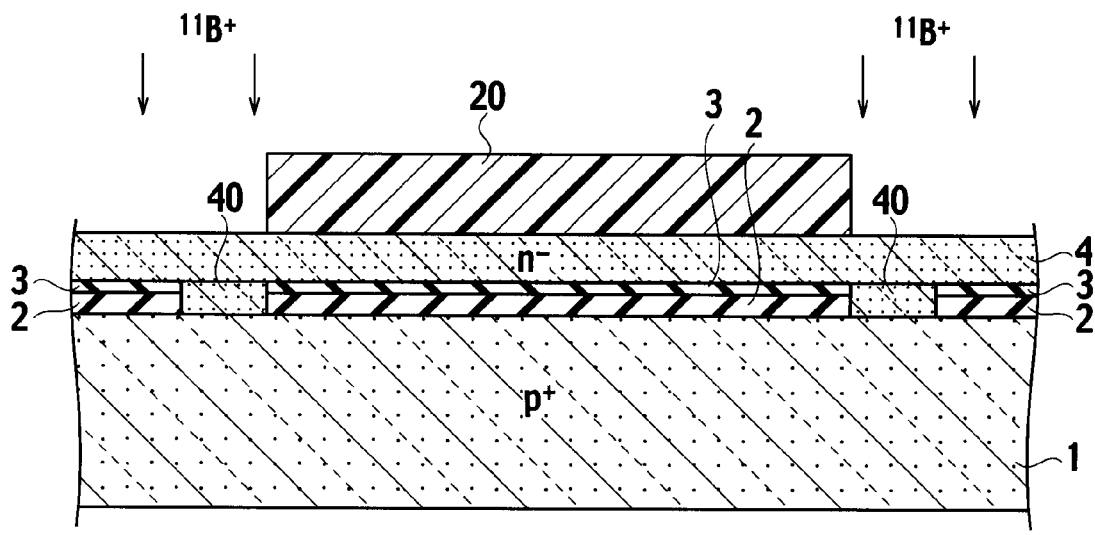
FIG. 13A is a cross-sectional view in the column direction showing the method for manufacturing the semiconductor memory.
Figure 13B:
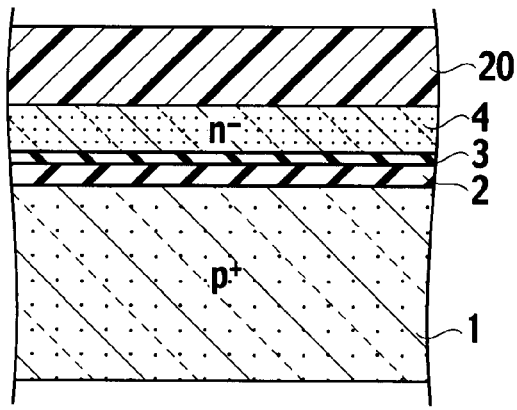
FIG. 13B is a cross-sectional view in the row direction showing the method for manufacturing the semiconductor memory.
Figure 14A:
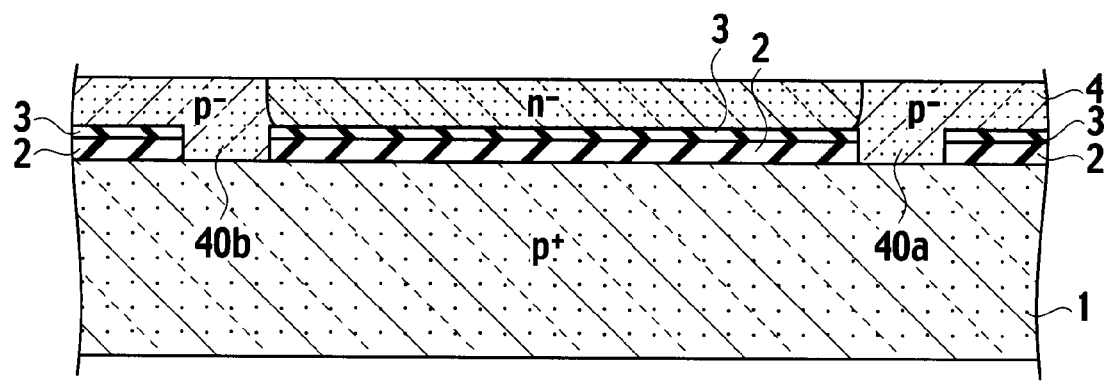
FIG. 14A is a cross-sectional view in the column direction showing the method for manufacturing the semiconductor memory.
Figure 14B:
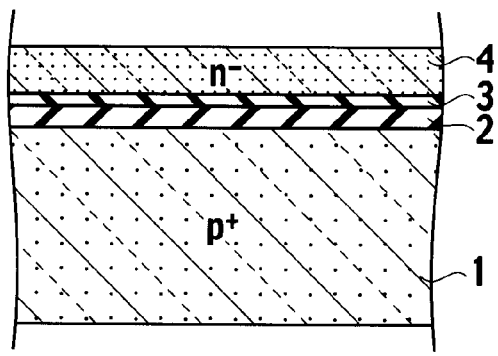
FIG. 14B is a cross-sectional view in the row direction showing the method for manufacturing the semiconductor memory.

A resist film 20 is spin-coated on the second semiconductor layer 4, and the resist film 20 is delineated by lithography technology. As shown in FIGS. 13A and 13B, by using the delineated resist film 20 as a mask, p-type impurity ions such as $^{11}B^+$ or the like are implanted. The resist film 20 is removed by a resist remover or the like. When deemed necessary, a resist film is also coated on the region surrounding the cell array, where the peripheral circuit is to be formed, and the coated resist film is delineated. Then, if necessary, ions are implanted. Then, impurity ions implanted in the first semiconductor layer 40 and the second semiconductor layer 4 are activated by thermal treatment. As a result, as shown in FIGS. 14A and 14B, $p^-$ type impurity diffusion layers 40a and 40b are formed in regions which will form select gated transistors.

Figure 15A:
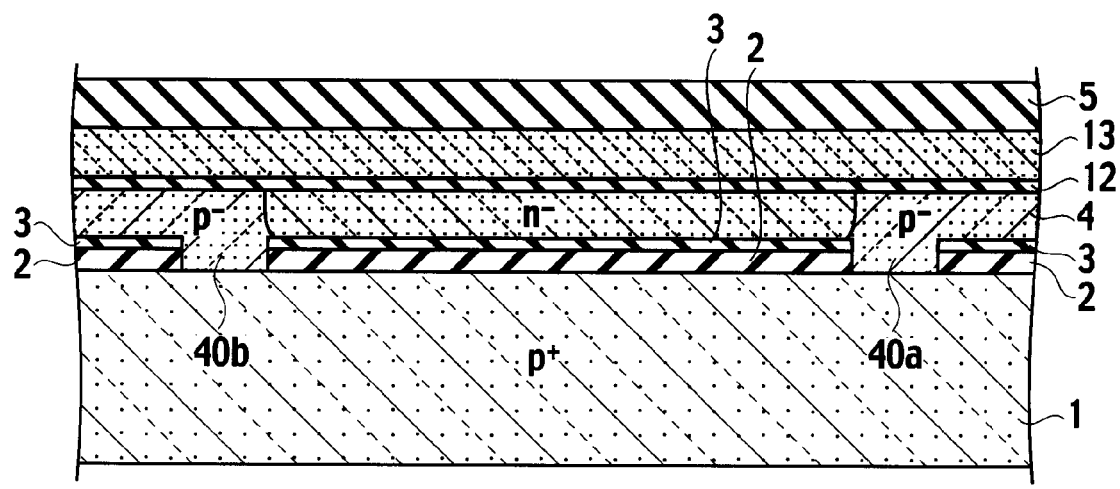
FIG. 15A is a cross-sectional view in the column direction showing the method for manufacturing the semiconductor memory.
Figure 15B:
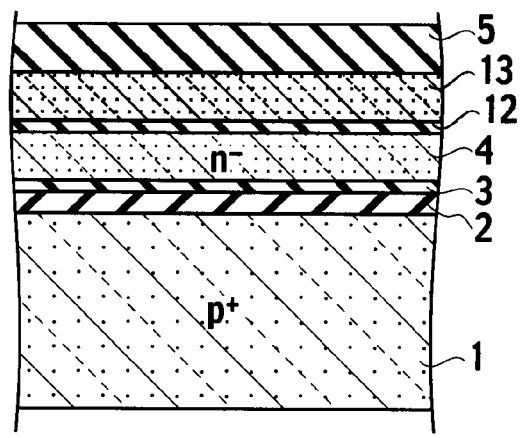
FIG. 15B is a cross-sectional view in the row direction showing the method for manufacturing the semiconductor memory.

As shown in FIGS. 15A and 15B, a gate insulating film (tunnel oxidation film) 12 such as $SiO_2$ film or the like, is formed by thermal oxidation so that the thickness of the gate insulating film 12 is in a range of approximately one nm to 15 nm. The gate insulating film 12 may be formed by radical oxidation, atomic layer deposition (ALD), reduced pressurized CVD (RPCVD), plasma CVD or the like instead of thermal oxidation. A first conductivity layer (floating gate electrode layer) 13 made of P-doped polysilicon or the like, which will become a floating gate electrode, is deposited on the gate insulating film 12 by reduced pressure CVD (RPCVD) or the like so that the thickness of the floating gate electrode layer 13 may be in a range of about ten nm to about 200 nm. Subsequently, a mask film 5, such as a $Si_3N_4$ film of the like, is deposited on the floating gate electrode layer 13 by CVD or the like so that the thickness of the mask film 5 may be approximately 50 nm to 200 nm.

Figure 16A:
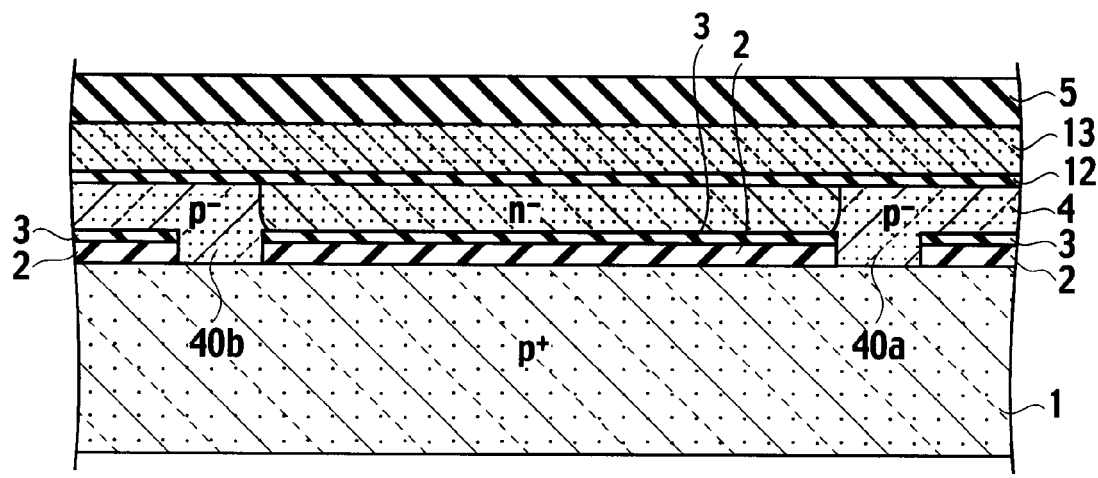
FIG. 16A is a cross-sectional view in the column direction showing the method for manufacturing the semiconductor memory.
Figure 16B:
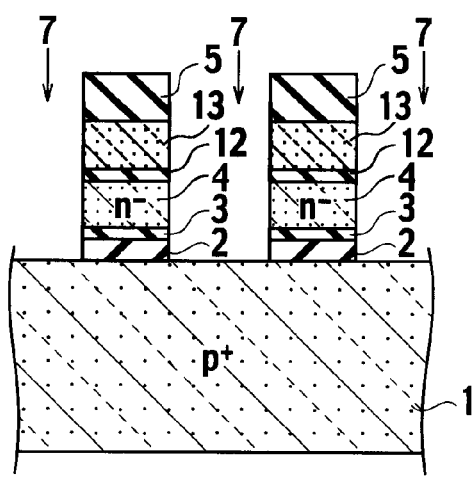
FIG. 16B is a cross-sectional view in the row direction showing the method for manufacturing the semiconductor memory.
Figure 17A:
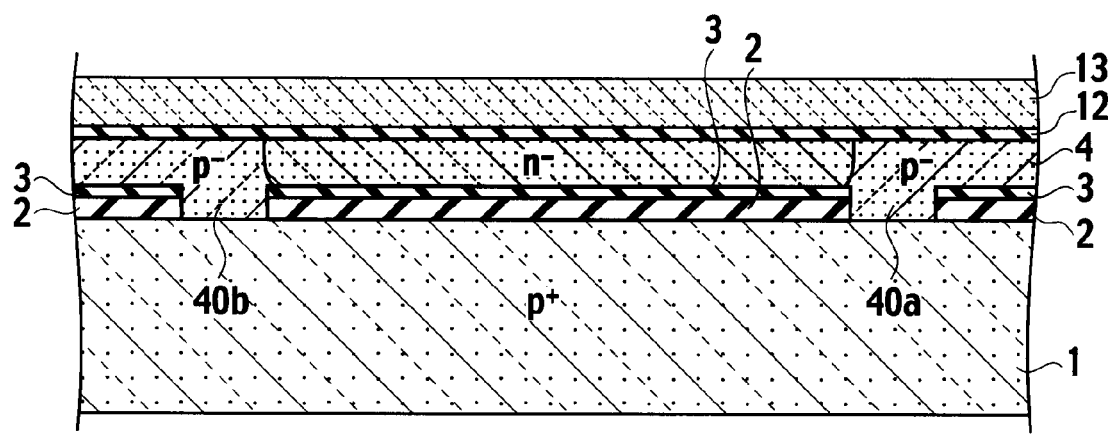
FIG. 17A is a cross-sectional view in the column direction showing the method for manufacturing the semiconductor memory.
Figure 17B:
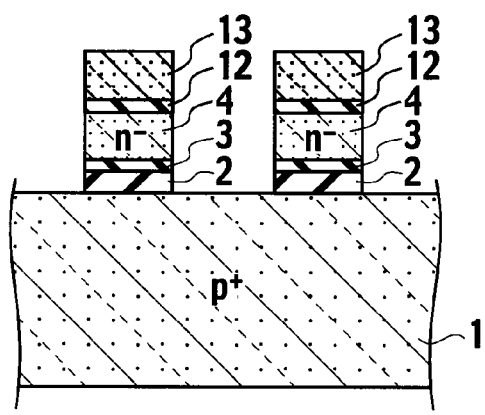
FIG. 17B is a cross-sectional view in the row direction showing the method for manufacturing the semiconductor memory.

A resist film is spin-coated on the mask film 5, and an etching mask of the resist film is delineated by photolithography. Parts of the mask film 5 are removed in a selective manner by RIE in which an etching mask is used. After etching, the resist film is removed. With the mask film 5 used as a mask, parts of the floating gate electrode layer 13, the gate insulating film 12 and the SOI layer 3 are selectively removed in the column direction until the buried insulating film 2 underneath is exposed. Parts of the mask material 5 are removed in a selective manner by reactive ion etching (RIE) in which an etching mask is used. After etching, the resist film is removed by a resist remover and the like. With the mask material 5 used as an etching mask, parts of the floating gate electrode layer 13, the gate insulating film 12, the second semiconductor layer 4, the second buried insulating film 3 and the first buried insulating film 2 are removed in the column direction in a selective manner. Consequently, first groove portions 7 are formed, which penetrate through the floating gate electrode layer 13, the gate insulating film 12, the second semiconductor layer 4, the second buried insulating film 3 and the first buried insulating film 2, as shown in FIGS. 16A and 16B. Thereafter, as shown in FIGS. 17A and 17B, the mask film 5 is removed with hot phosphoric acid ($H_3PO_4$) or the like.

Figure 18A:
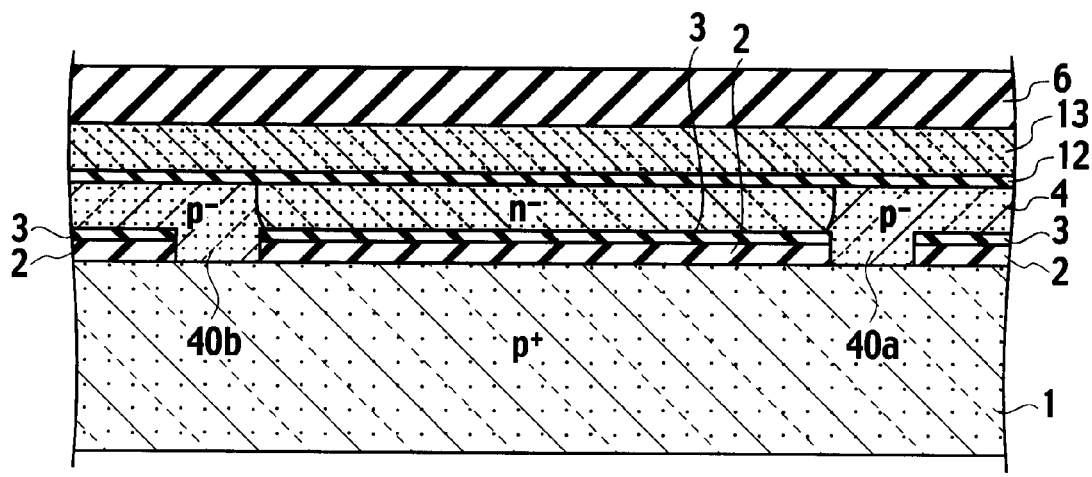
FIG. 18A is a cross-sectional view in the column direction showing the method for manufacturing the semiconductor memory.
Figure 18B:
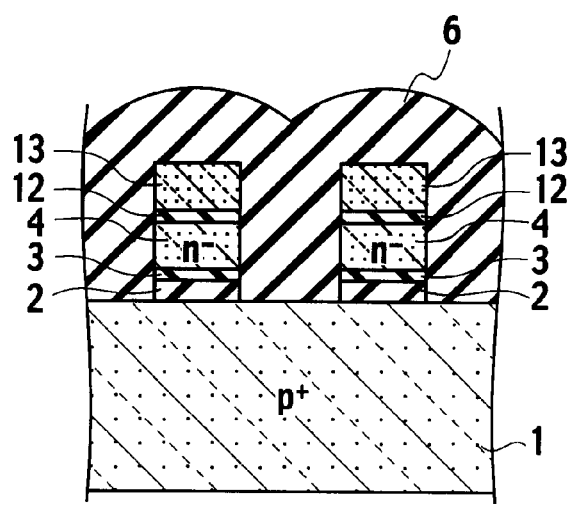
FIG. 18B is a cross-sectional view in the row direction showing the method for manufacturing the semiconductor memory.
Figure 19A:
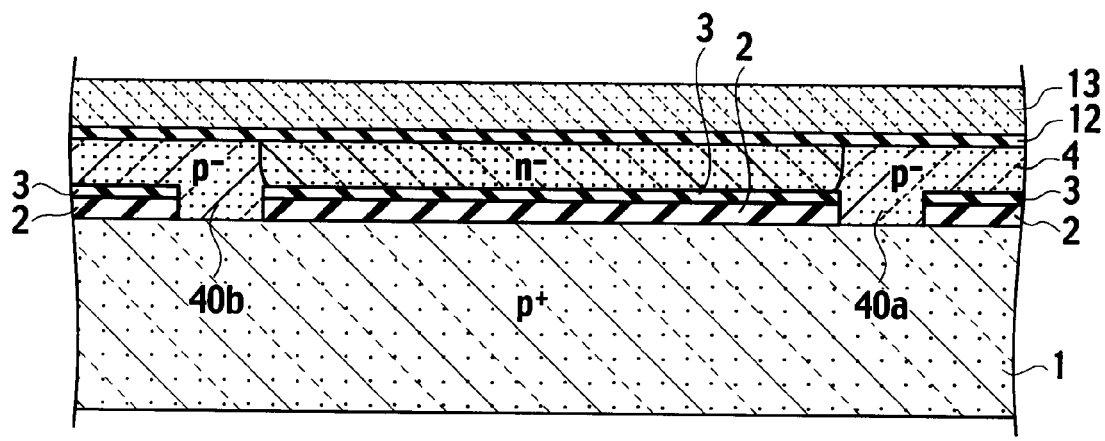
FIG. 19A is a cross-sectional view in the column direction showing the method for manufacturing the semiconductor memory.
Figure 19B:
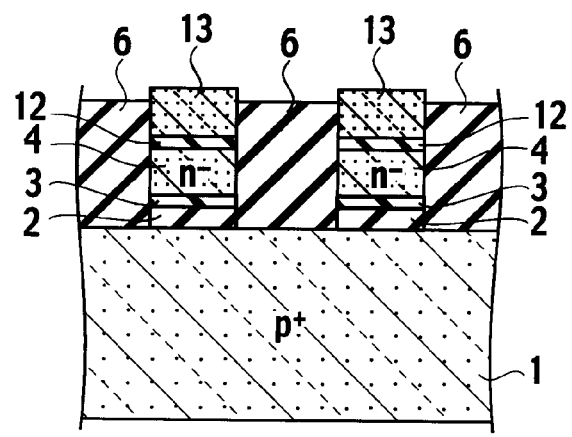
FIG. 19B is a cross-sectional view in the row direction showing the method for manufacturing the semiconductor memory.

As shown in FIGS. 18A and 18B, an element isolation insulating film 6 is buried in the groove portions 7 by CVD or the like so that the thickness of the element isolation insulating film 6 is approximately 200 nm to 1,500 nm. As shown in FIGS. 19A and 19B, the element isolation insulating film 6 is etched back by use of CMP so that the element isolation insulating film 6 may be planarized. The upper surfaces of the element isolation insulating films 6 are situated in positions higher than the upper surfaces of the gate insulating films 12.

Figure 20A:
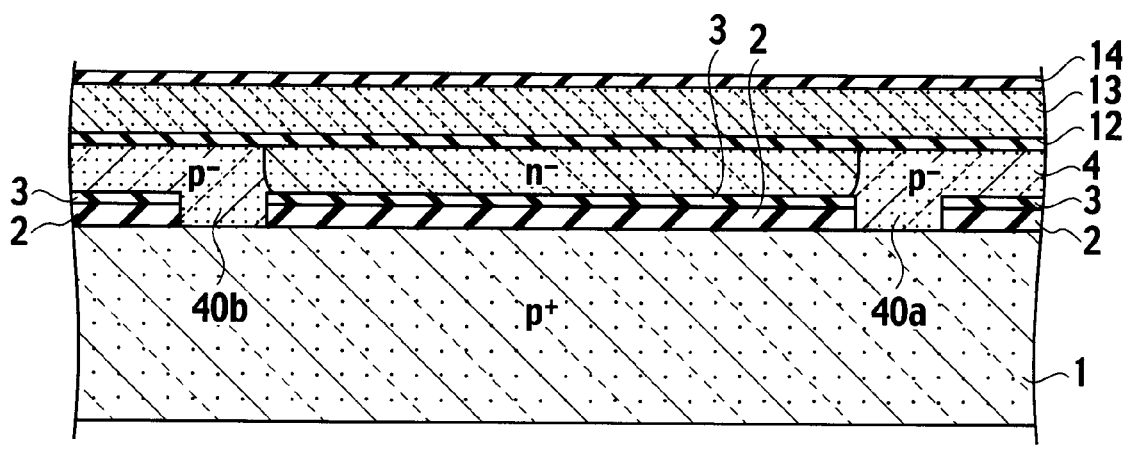
FIG. 20A is a cross-sectional view in the column direction showing the method for manufacturing the semiconductor memory.
Figure 20B:
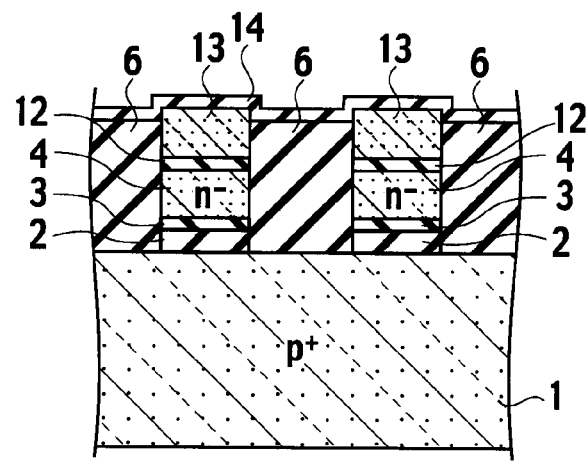
FIG. 20B is a cross-sectional view in the row direction showing the method for manufacturing the semiconductor memory.
Figure 21A:
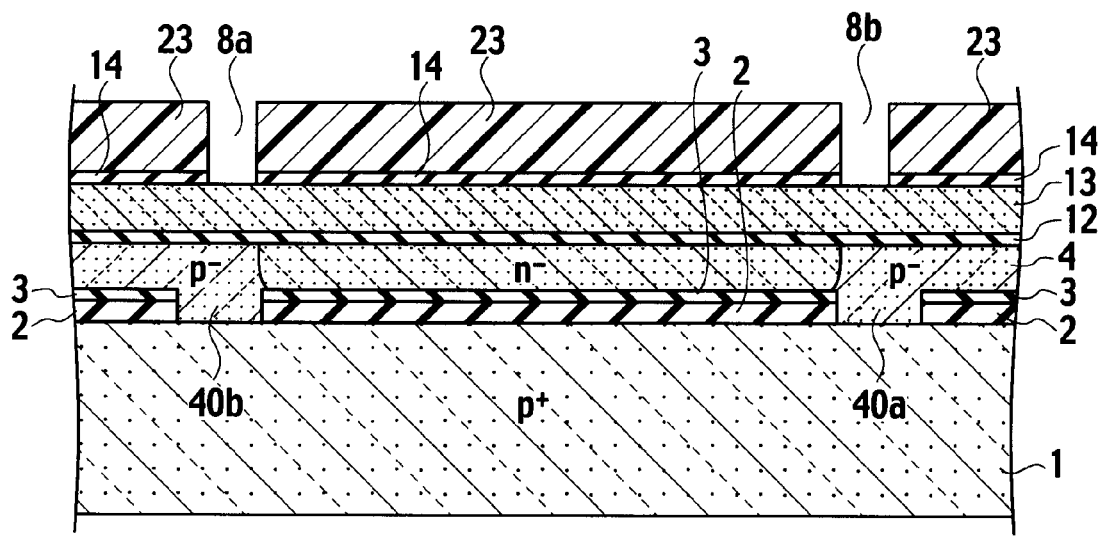
FIG. 21A is a cross-sectional view in the column direction showing the method for manufacturing the semiconductor memory.
Figure 21B:
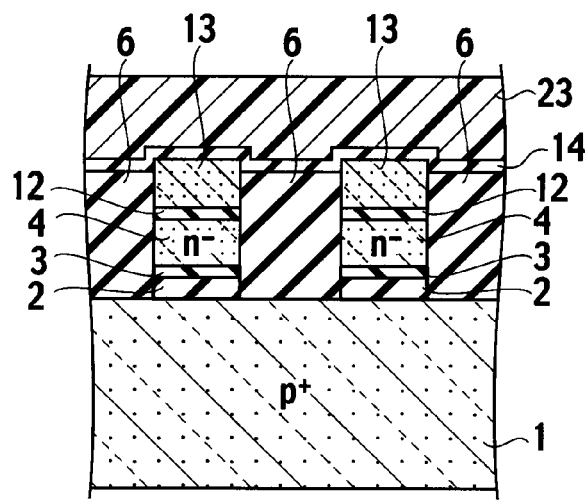
FIG. 21B is a cross-sectional view in the row direction showing the method for manufacturing the semiconductor memory.
Figure 22A:
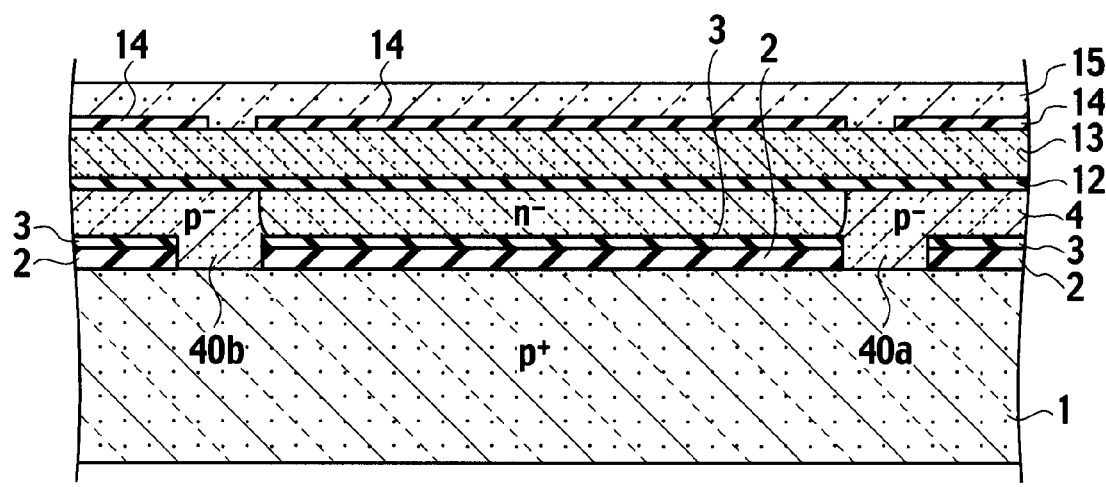
FIG. 22A is a cross-sectional view in the column direction showing the method for manufacturing the semiconductor memory.
Figure 22B:
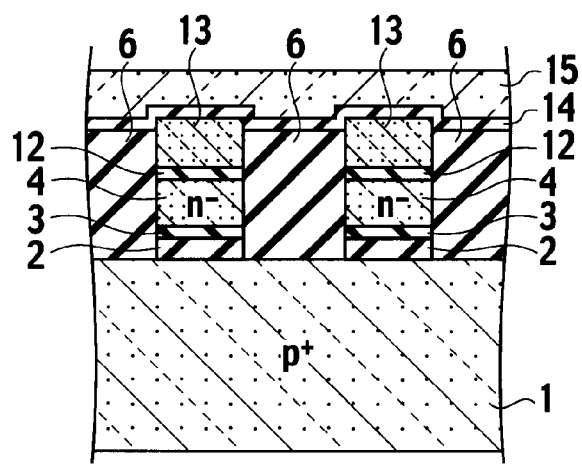
FIG. 22B is a cross-sectional view in the row direction showing the method for manufacturing the semiconductor memory.

Next, as shown in FIGS. 20A and 20B, an inter-electrode insulating film 14 is deposited on the tops of the floating gate electrode layers 13 and the tops of the element isolation insulating films 6 by CVD or the like. A resist film 23 is coated on the inter-electrode insulating film 14, and the resist film 23 is delineated by a lithographic technique. As shown in FIGS. 21A and 21B, window portions 8 are formed in a part of the inter-electrode insulating film 14 by RIE or the like with the delineated resist film 23 used as a mask. As shown in FIGS. 22A and 22B, a second conductivity layer (control gate electrode layer) 15 made of P-doped polysilicon or the like, which will be a control gate electrode, is deposited on the inter-electrode insulating film 14 by CVD so that the thickness of the control gate electrode layer 15 is approximately 10 nm to 200 nm. Here, a part of the control gate electrode layer 15, which will be a the control gate electrode of the select gate transistor, contacts a part of the floating gate electrode layer 13, which will be a floating gate electrode of the select gate transistor, through the window portions 8a and 8b.

Figure 23A:
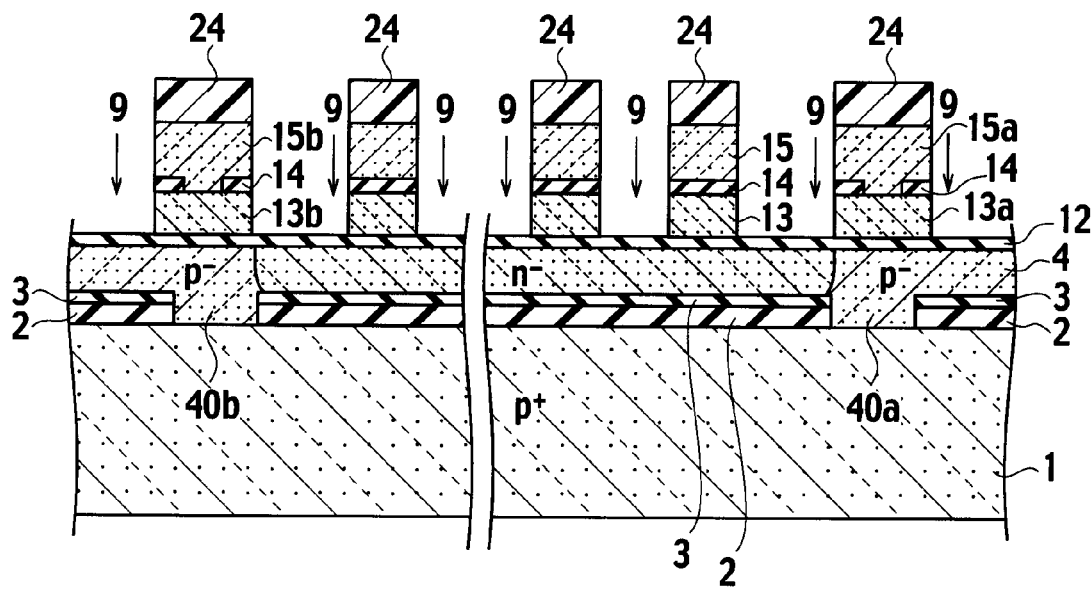
FIG. 23A is a cross-sectional view in the column direction showing the method for manufacturing the semiconductor memory.
Figure 23B:
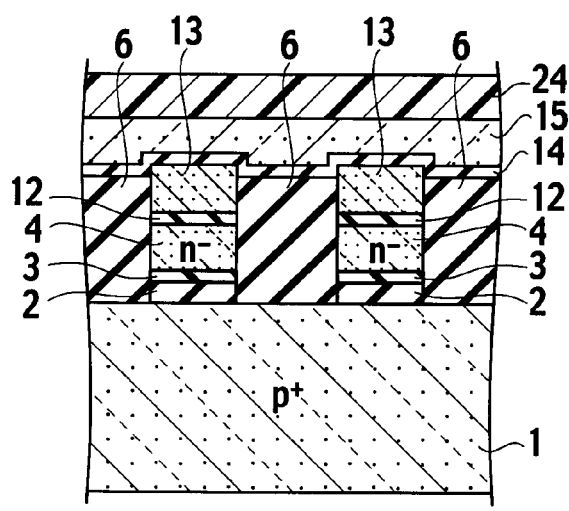
FIG. 23B is a cross-sectional view in the row direction showing the method for manufacturing the semiconductor memory.

A resist film 24 is spin-coated on the control gate electrode layer 15, and the resist film 24 is delineated by a lithographic technique. As shown in FIGS. 23A and 23B, parts of the control gate electrode layer 15, the inter electrode insulating layer 14, and the floating gate electrode layer 13 are removed in the row direction, with the delineated resist film 24 used as a mask, by RIE in a selective manner until the gate insulating film 12 underneath the parts is exposed. Consequently, second groove portions (the cell isolation groove portions) 9, which penetrate the control gate electrode layer 15, the inter-electrode insulating films 14, and the floating gate electrode layer 13, are formed. As a result, arrangements of gate structures including the control gate electrode 15, the inter-electrode insulating films 14, the floating gate electrode 13 and the gate insulating film 12 are formed. Note that, a part of the gate insulating film 12 may be also selectively removed in the row direction. As a result, the second groove portions (the cell isolation groove portion) are formed and penetrate through the control gate electrode layer 15, the inter-electrode insulating film 14, the floating gate electrode layer 13 and the gate insulating film 12. The select gate electrodes 13a and 15a and select gate electrodes 13b and 15b are formed in regions for forming select gate transistors. The resist film 24 is removed by a resist remover and the like.

Figure 24A:
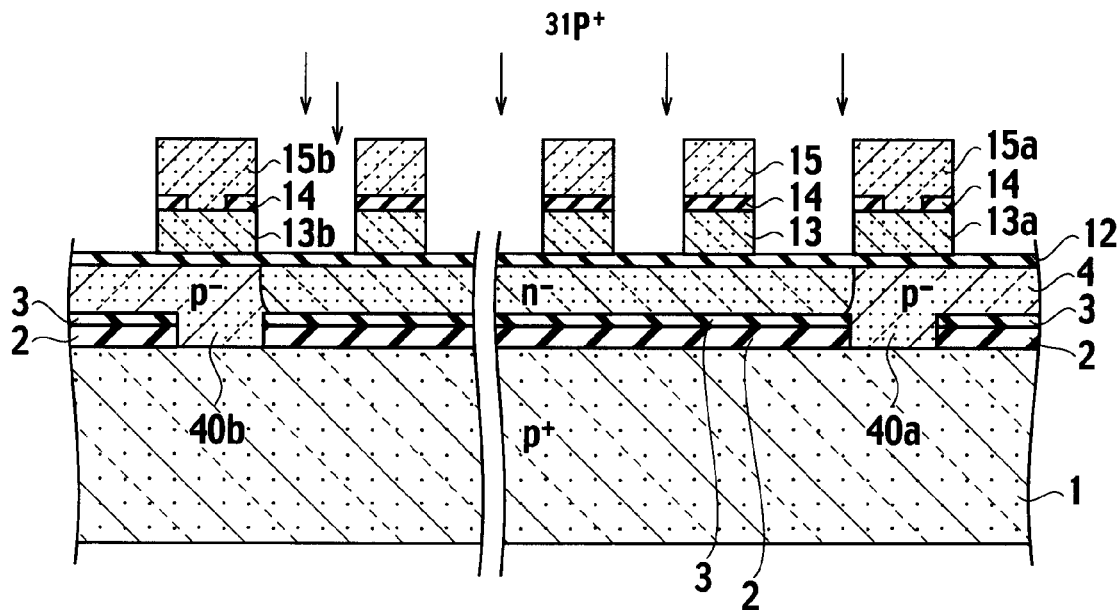
FIG. 24A is a cross-sectional view in the column direction showing the method for manufacturing the semiconductor memory.
Figure 24B:
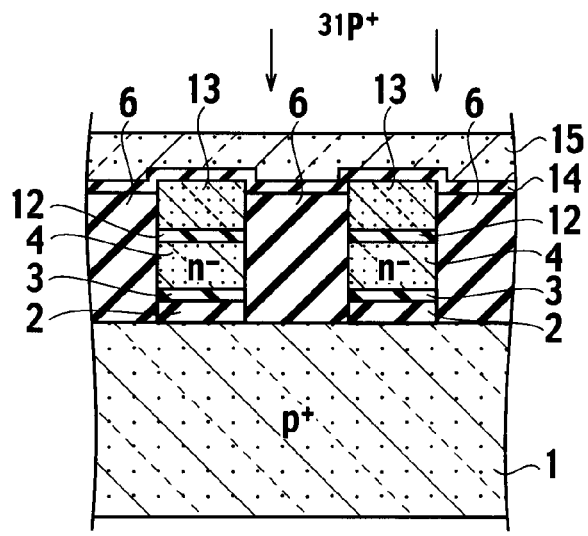
FIG. 24B is a cross-sectional view in the row direction showing the method for manufacturing the semiconductor memory.
Figure 25A:
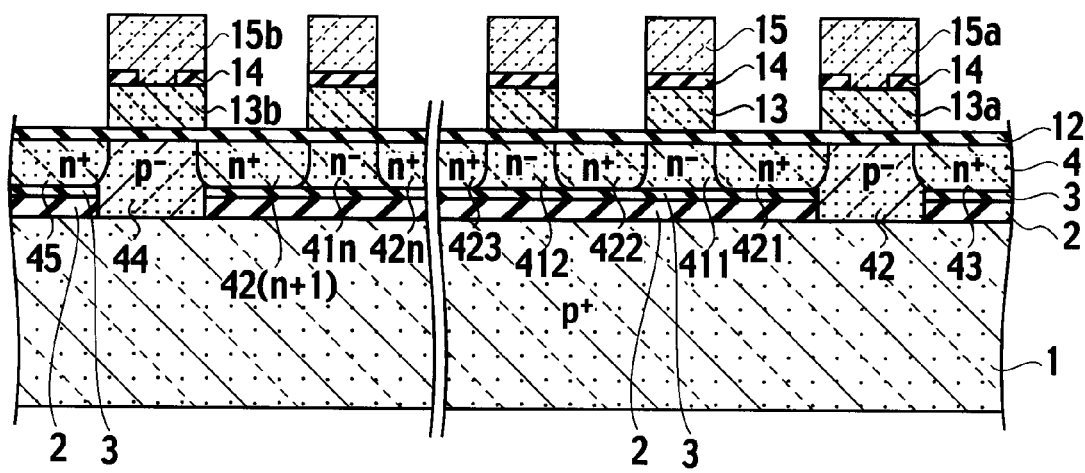
FIG. 25A is a cross-sectional view in the column direction showing the method for manufacturing the semiconductor memory.
Figure 25B:
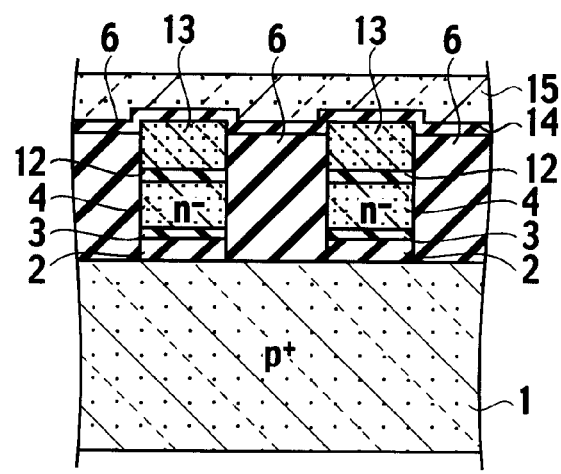
FIG. 25B is a cross-sectional view in the row direction showing the method for manufacturing the semiconductor memory.

As shown in FIGS. 24A and 24B, ions of $^{31}P^+$ or $^{75}As^+$ are implanted through the gate insulating films 12 in a self-aligned manner with the control gate electrode 15 used as a mask. Subsequently, n-type impurity ions of the floating gate electrodes 13 and the control gate electrodes 15 are activated by thermal treatment. As shown in FIGS. 25A and 25B, p-type impurity ions and n-type impurity ions in the second semiconductor layer 4 are activated. Accordingly, n⁺-type impurity diffusion layers (source and drain regions) 421 to 42 (n+1) are formed in the second semiconductor layer 4 at the bottom of the second groove portions 9, and an n⁻-type channel region 411 to 41(n+1) is formed in the second semiconductor layer 4 underneath the floating gate electrodes 13. Consequently, the depletion mode memory cell transistor $MT_{11}$ to $MT_{1n}$ is formed. Consequently, a plurality of memory cell transistors, although the illustration omitted, are arranged in the column direction and in the row direction so as to implement a matrix. Simultaneously, a p⁻-type impurity diffusion layer (channel region) 42 is formed in the third semiconductor layer 3, and an n⁺-type impurity diffusion layer (source region) 43 is formed. Thereby, an enhancement mode select gate transistor $STS_1$ is formed. Also, the n⁺-type impurity diffusion layer (drain region) 45 and the p⁻-type impurity diffusion layer (channel region) 44 between the drain region 45 and the source region 42 (n+1) are formed in the second semiconductor layer 4. Thereby, the enhancement mode select gate transistor $STD_1$ is also formed.

Figure 26A:
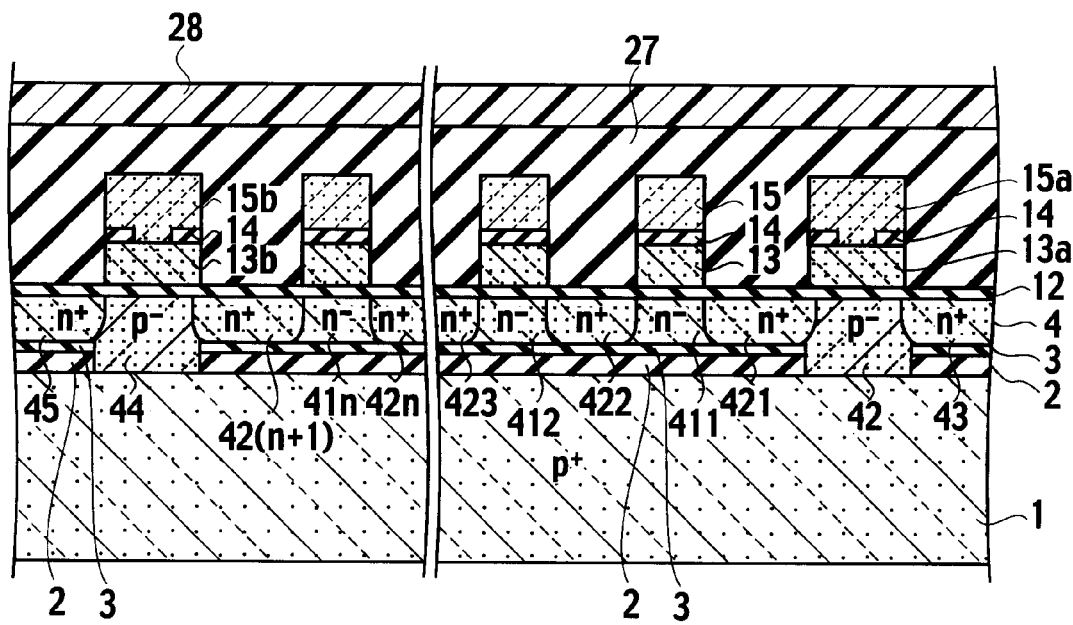
FIG. 26A is a cross-sectional view in the column direction showing the method for manufacturing the semiconductor memory.
Figure 26B:
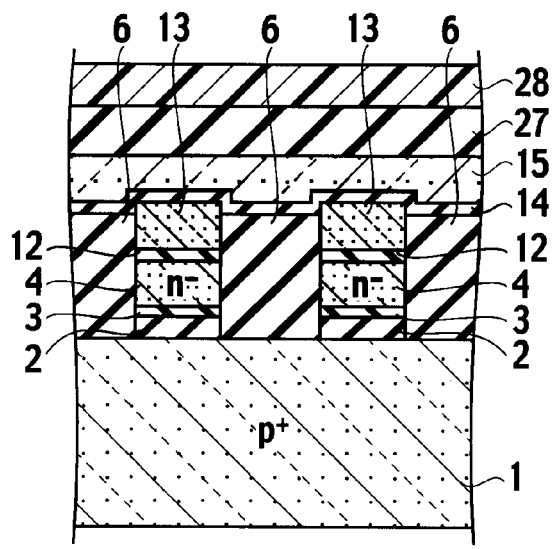
FIG. 26B is a cross-sectional view in the row direction showing the method for manufacturing the semiconductor memory.
Figure 27A:
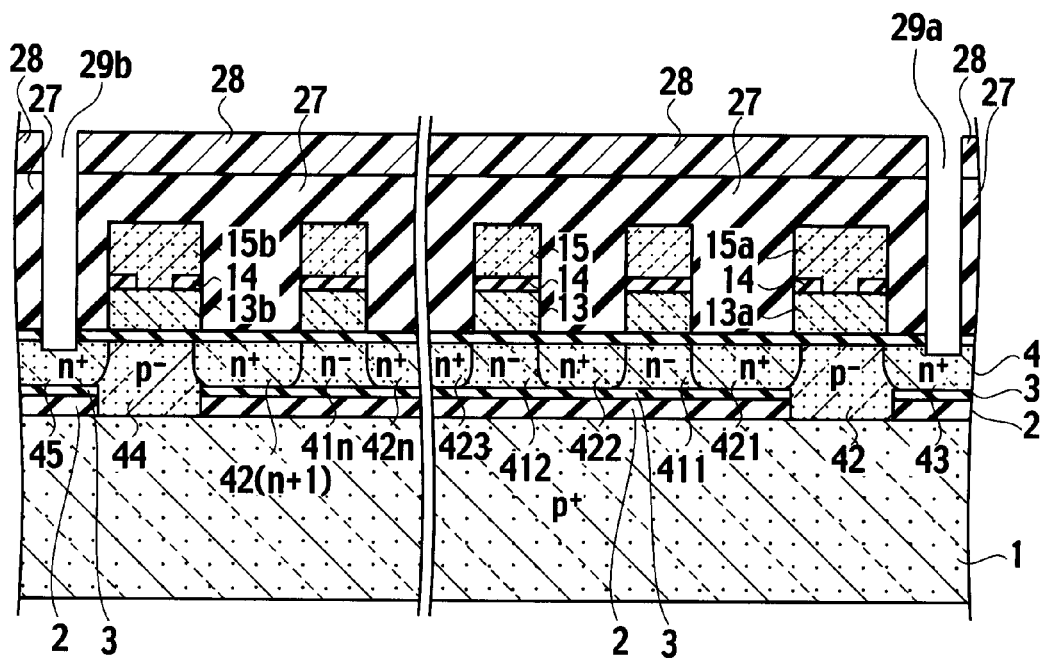
FIG. 27A is a cross-sectional view in the column direction showing the method for manufacturing the semiconductor memory.
Figure 27B:
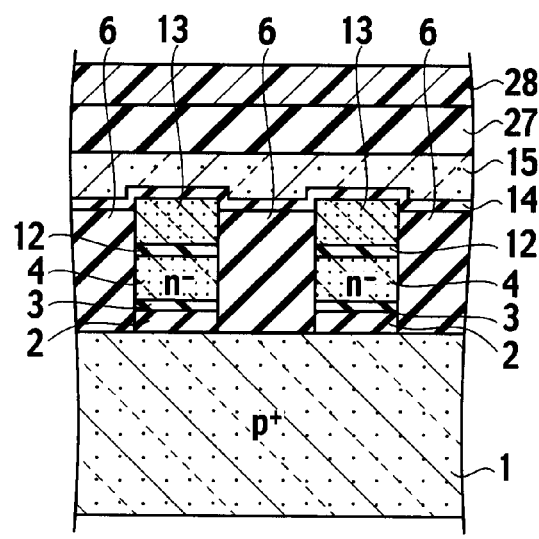
FIG. 27B is a cross-sectional view in the row direction showing the method for manufacturing the semiconductor memory.

As shown in FIGS. 26A and 26B, an interlayer insulating film 27 is deposited by CVD or the like and a resist film 28 is coated on the interlayer insulating film 27. Thereafter, the resist film 28 is delineated by lithography technology. As shown in FIGS. 27A and 27B, window portions (contact holes) 29a and 29b are formed by RIE and the like using the delineated resist film 28 as a mask. The window portions 29a and 29b penetrate the interlayer insulating film 27 and respectively extend to the source region 43 or the drain region 45. Thereafter, a metal film is buried in each of the window portions 29a and 29b by CVD or the like to form the source line contact plug 18 and the bit line contact plug 17 so that the source line contact plug 18 and the bit line contact plug 17 are respectively connected to the source region 43 and the drain region 45. Finally, predetermined interconnects and insulating films are formed or deposited.

In the CMP process described referring to FIG. 11, if the CMP is performed by using a single-layer buried insulating film ($SiO_2$ film) as the stopper, the surface of the buried insulating film is lost, and defects enter in the cross-sectional direction of the buried insulating film and cause dielectric breakdown. To avoid this, in accordance with the manufacturing method of the semiconductor memory according to the embodiment of the present invention, as described above, the second buried insulating film 3 is deposited on the first buried insulating film ($SiO_2$ film) 2, and the second buried insulating film 3 is used as the stopper in the CMP process. The first buried insulating film 2 and the second buried insulating film 3 are not the same or continuous films. Accordingly, even if a surface defects of the second buried insulating film 3, which is introduced by the CMP, propagates in the vertical direction, the defects can be kept within the second buried insulating film 3. Hence, the defects can be suppressed from being introduced into the first buried insulating film 2. Accordingly, it is possible to suppress deteriorations of the turn-off characteristics and breakdown voltage of the memory cell transistors $MT_{11}$ to $MT_{mn}$ and the selection gate transistors $STS_1$ to $STS_m$ and $STD_1$ to $STD_m$, in which the deteriorations are caused by the defects. In particular, in the window portions of the first buried insulating film 2 and the second buried insulating film 3, the selection gate transistors $STS_1$ to $STS_m$ and $STD_1$ to $STD_m$ are formed, and accordingly, the deteriorations of the turn-off characteristics and breakdown voltage of the selection gate transistors $STS_1$ to $STS_m$ and $STD_1$ to $STD_m$ are suppressed significantly.

Moreover, the second buried insulating film 3 has stronger mechanical strength than the $SiO_2$ film. Accordingly, any defects introduced into the second buried insulating film 3 by the CMP can be suppressed more than in the case of using the $SiO_2$ film as the stopper for the CMP.

Furthermore, if the single-layer buried insulating film ($SiO_2$ film) is used when the natural oxidation film is removed in the pretreatment after the CMP process described by using FIG. 11, then the buried insulating film is also dissolved by the HF solution, and is decreased in amount. Therefore, step differences due to such a decreased amount of the buried insulating film appear on the semiconductor layer deposited on the semiconductor substrate 1 and the buried insulating film. As opposed to this, in accordance with the manufacturing method of the semiconductor memory according to the embodiment of the present invention, when the natural oxidation film is removed in the pretreatment, the decrease of the first buried insulating film 2 can be prevented by using, as a protective film, the second buried insulating film 3 which has resistant against chemical reaction by HF. Accordingly, it is possible to suppress the step differences of the second semiconductor layer 4 from being formed.

As described above, according to the embodiment of the present invention, the semiconductor memory and the manufacturing method of the semiconductor memory, which make it possible to suppress the deteriorations of the turn-off characteristics and the breakdown voltage, can be provided.

(First Modification)

Figure 28:
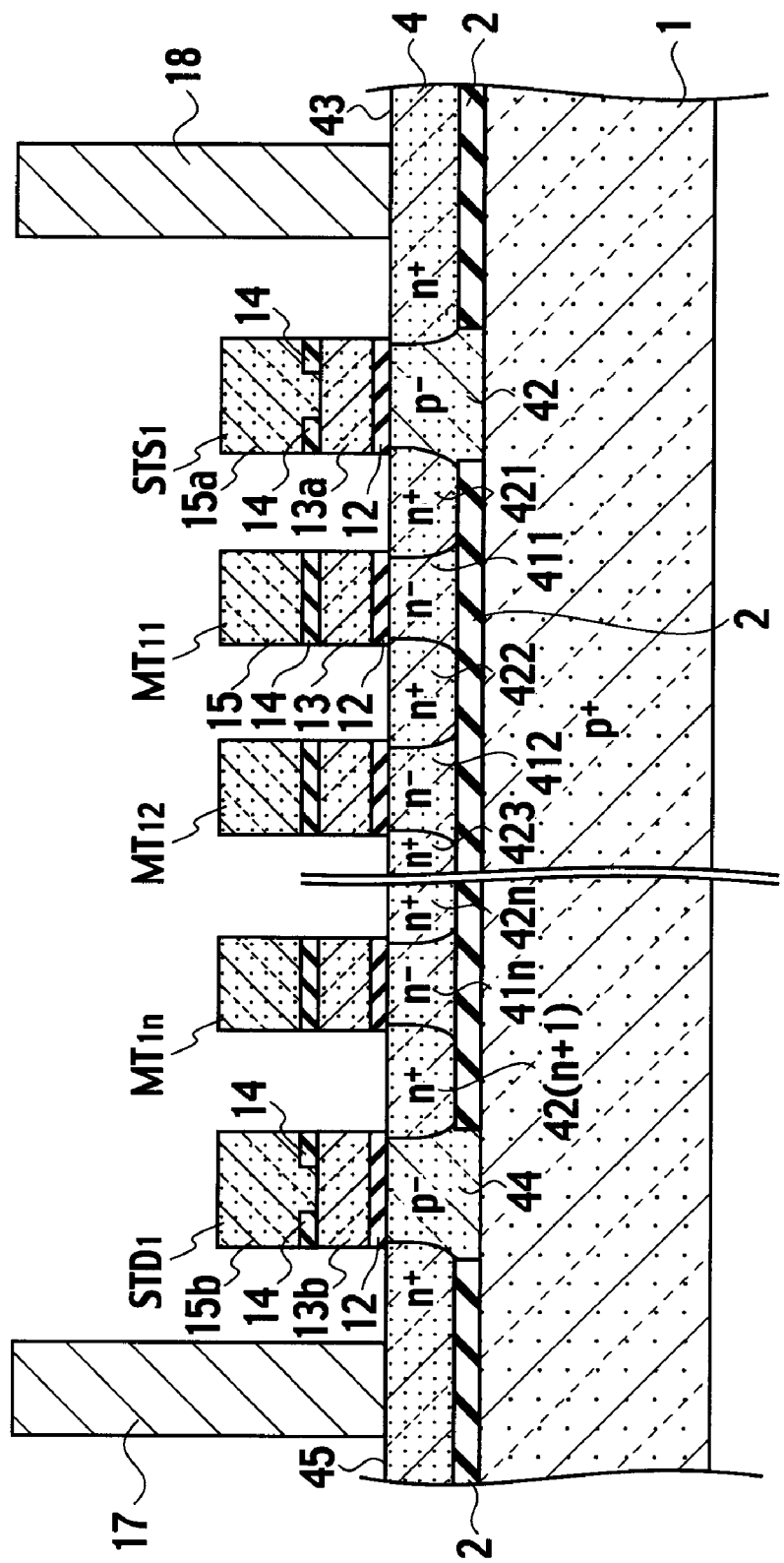
FIG. 28 is a cross-sectional view in the column direction showing an example of a semiconductor memory according to a first modification.
Figure 29:
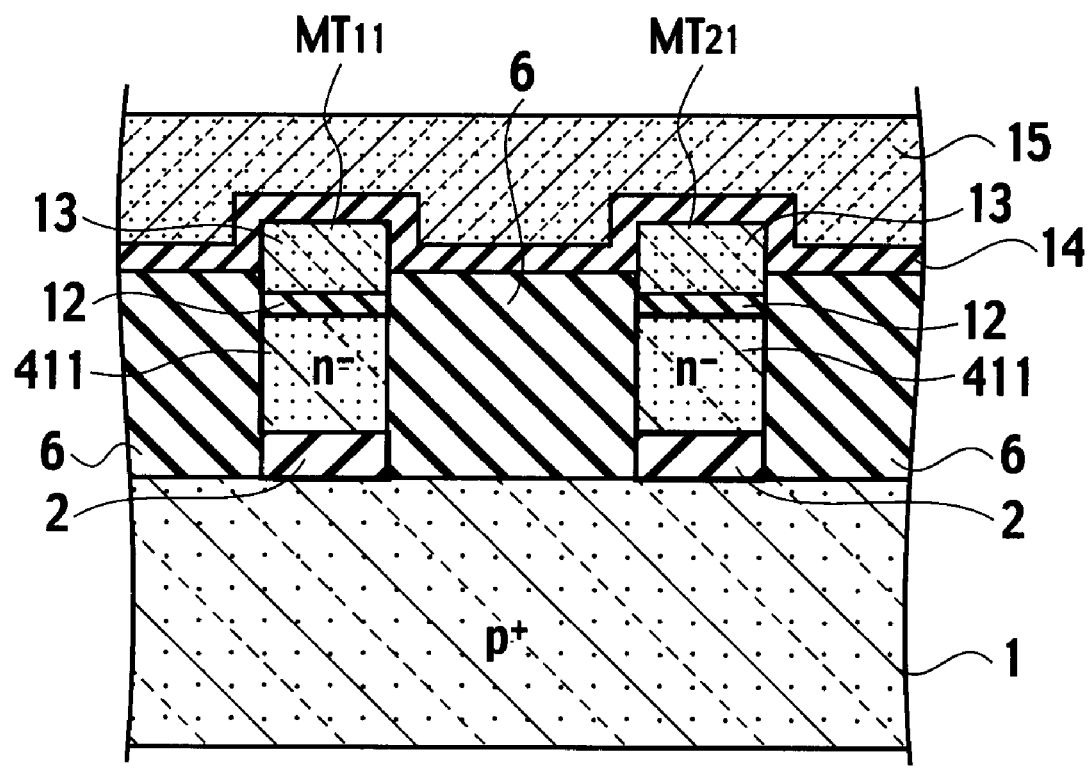
FIG. 29 is a cross-sectional view in the row direction showing the semiconductor memory according to the first modification.

As shown in a cross sectional view in the column direction of FIG. 28 and the row direction of FIG. 29, a semiconductor memory according to a first modification of the embodiment of the present invention is different at the point of providing a single-layer first buried insulating film 2 between the semiconductor substrate 1 and the semiconductor layer 4 from the semiconductor memory including the first buried insulating film 2 and the second buried insulating film 3 shown in FIG. 1.

Figure 30A:
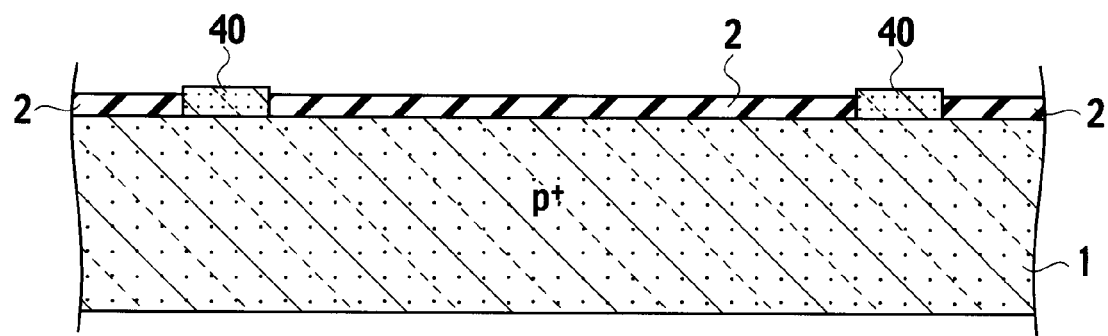
FIG. 30A is a cross-sectional view in the column direction showing a method for manufacturing the semiconductor memory according to the first modification.
Figure 30B:
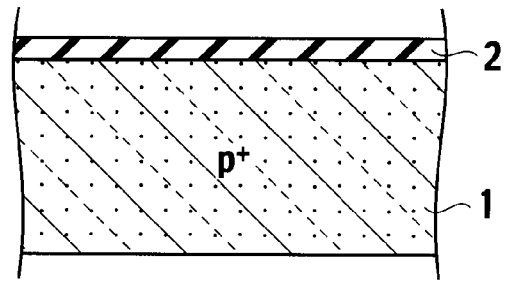
FIG. 30B is a cross-sectional view in the row direction showing the method for manufacturing the semiconductor memory according to the first modification.
Figure 31A:
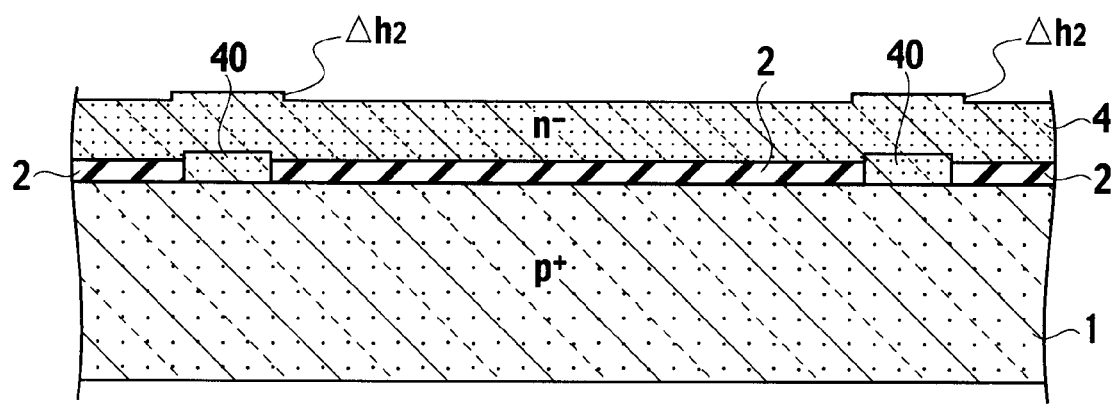
FIG. 31A is a cross-sectional view in the column direction showing the method for manufacturing the semiconductor memory according to the first modification.
Figure 31B:
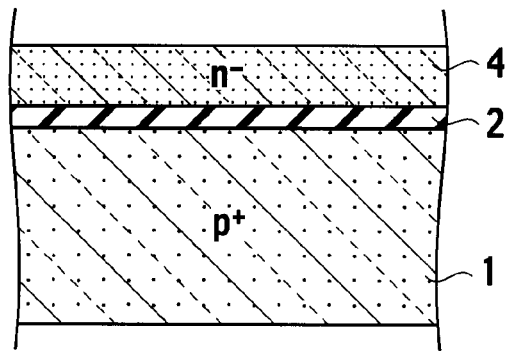
FIG. 31B is a cross-sectional view in the row direction showing the method for manufacturing the semiconductor memory according to the first modification.

With regard to a method for manufacturing the semiconductor memory according to the first modification of the embodiment of the present invention, as described above, after the sequence of steps already explained referring to FIGS. 8A to 11B, the second buried insulating film 3 is peeled off entirely with $H_3PO_4$ or the like, as shown in FIGS. 30A and 30B. Next, as shown in FIGS. 31A and 31B, a second semiconductor layer 4 is deposited on the first semiconductor layer 40 and the first buried insulating film 2. Since other steps in the procedure are substantially the same as those in FIGS. 13A to 27B, a redundant description thereof will be omitted.

When the thicknesses of the first buried insulating film 2 and the second buried insulating film 3 shown in FIG. 10 are approximately 40 nm, the step difference Δh1 of the semiconductor layer 4 becomes approximately 40 nm. By contrast, the thickness of the second buried insulating film 3 shown in FIG. 31A is approximately 5 nm, and it is possible to decrease the step difference Δh2 formed by peeling off the second buried insulating film 3 to approximately 10% compared with the step difference Δh1.

Furthermore, in the case where the second semiconductor layer 4 shown in FIG. 31 is deposited by CVD, it is possible to provide the same surface level of the second semiconductor layer 4 by increasing the deposition rate of Si on the first buried insulating film ($SiO_2$ film) 2 higher than the deposition rate of Si on the planarized first semiconductor layer (single crystal Si) 40.

Furthermore, in the case where the second semiconductor layer 4 is deposited by epitaxial growth, it is possible to provide the same surface level of the second semiconductor layer 4 by selecting growth condition and decreasing growth rate on the first semiconductor layer (single crystal Si) 40 to be less than the growth rate on the first buried insulating film (SiO$_2$ film) 2.

In accordance with the method for manufacturing the semiconductor memory according to the first modification of the embodiment of the present invention, the CMP process is performed with the second buried insulating film 3 as a stopper, and thereafter the second buried insulating film 3 is peeled off before depositing the second semiconductor layer 4. Therefore, it is possible to prevent introduction of defects in the first buried insulating film 2, and suppress the deterioration of the turn-off characteristics and the breakdown voltage.

(Second Modification)

A semiconductor memory according to the second modification of the embodiment of the present invention is schematically similar to the structure shown in FIGS. 28 and 29. However, an insulating film made of a material, which has higher dielectric constant than SiO$_2$, is used as the first buried insulating film 2 instead of SiO$_2$ film. A high-k material such as silicon nitride (SiN), silicon oxide nitride (SiON), alumina (Al$_2$O$_3$) or the like can be used as the material, which has higher dielectric constant than SiO$_2$.

In accordance with the semiconductor memory according to the second modification of the embodiment of the present invention, an insulating film made of a material, which has higher dielectric constant than SiO$_2$, is used as the first buried insulating film 2. Therefore, it is possible to suppress leakage current and maintain effects of turn-off characteristics by a back gate, as compared with using SiO$_2$.

With regard to a method for manufacturing the non-volatile semiconductor memory according to the second modification of the embodiment of the present invention, in the procedure shown in FIGS. 8A and 8B, an insulating film made of a material such as SiN, SiON, Al$_2$O$_3$ or the like, which has higher dielectric constant than SiO$_2$, may be deposited as the first buried insulating film 2, and an insulating film made of a material such as SiO$_2$, SiN, SiON, Al$_2$O$_3$ or the like may be deposited as the second buried insulating film 3. At this time, as the second buried insulating film 3, a material which can provide selectivity against the first buried insulating film 2, may be used. Since other steps in the procedure are substantially the same as those in FIGS. 9A to 27B, a redundant description thereof will be omitted.

(Third Modification)

Figure 32:
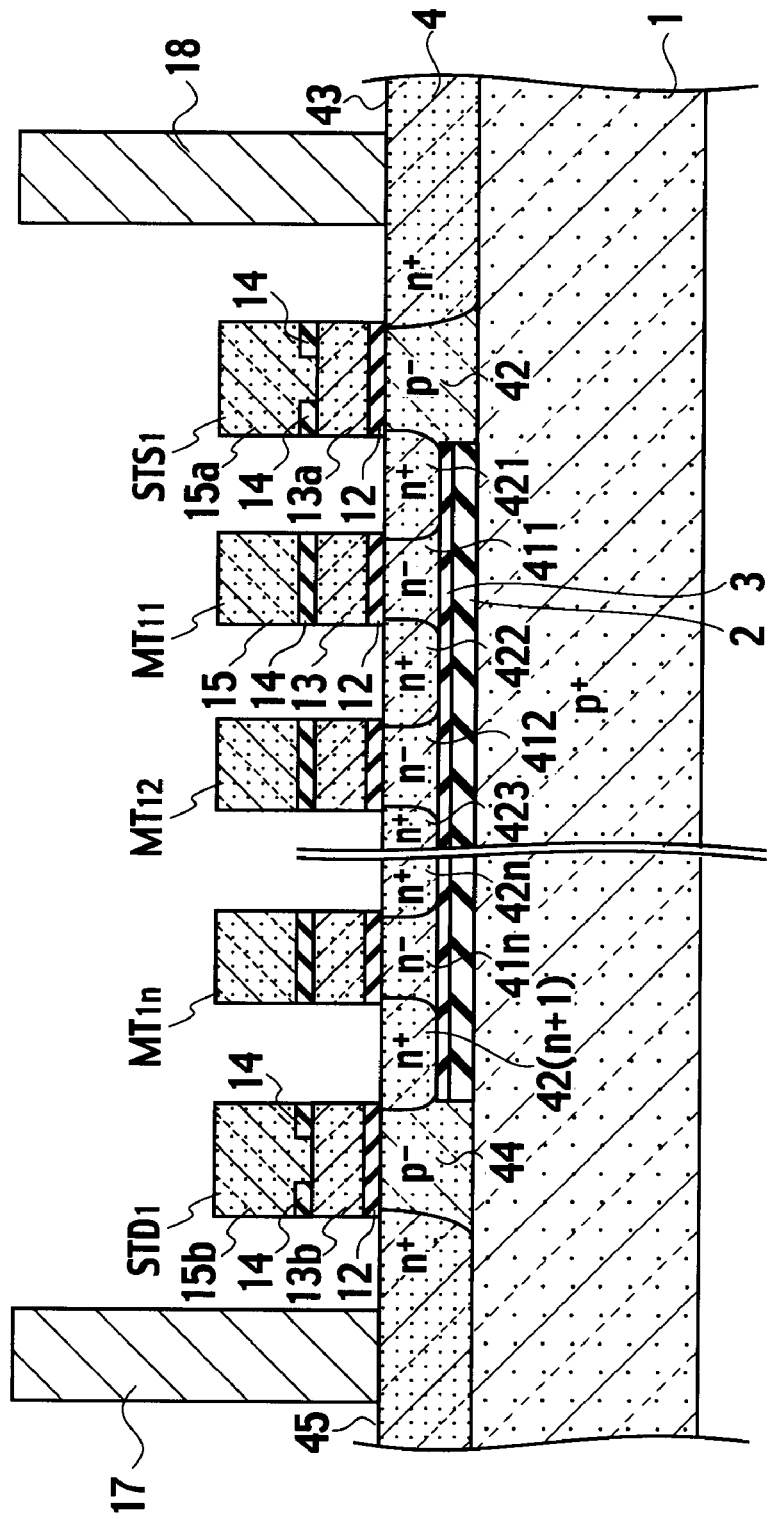
FIGS. 32 and 33 are cross-sectional views in the column direction showing an example of a semiconductor memory according to a third modification of the embodiment of the present invention.

As a third modification of the embodiment of the present invention, a description will be provided for an example in which a partial SOI region is different from the semiconductor memory shown in FIG. 1. As shown in FIG. 32, a first buried insulating film 2 and a second buried insulating film 3 are selectively provided under an arrangement of the memory cell transistors MT$_{11}$ to MT$_{1n}$. A channel region 42 and a source region 43 of a select gate transistor STS$_1$ and a channel region 44 and a drain region 45 of a select gate transistor STD$_1$ are contacted with a semiconductor substrate 1.

In accordance with the third modification of the embodiment of the present invention, the memory cell transistors MT$_{11}$ to MT$_{1n}$ may be formed in the partial SOI region by providing the first buried insulating film 2 and the second buried insulating film 3 under at least the arrangement of the memory cell transistors MT$_{11}$ to MT$_{1n}$.

With regard to a method for manufacturing the non-volatile semiconductor memory according to the third modification of the embodiment of the present invention, after the sequence of processes explained in FIGS. 8A and 8B, regions of the second buried insulating film 3, in which an arrangement of the memory cell transistors MT$_{11}$ to MT$_{1n}$ will be formed, are masked with a resist film or the like. Parts of the first buried insulating film 2 and the second buried insulating film 3 will be formed on the source region 43 and the channel region 42 of the select gate transistor STS1 shown in FIG. 32 and the drain region 45 and the channel region 44 of the select gate transistor STD1, may be removed selectively.

Figure 33:
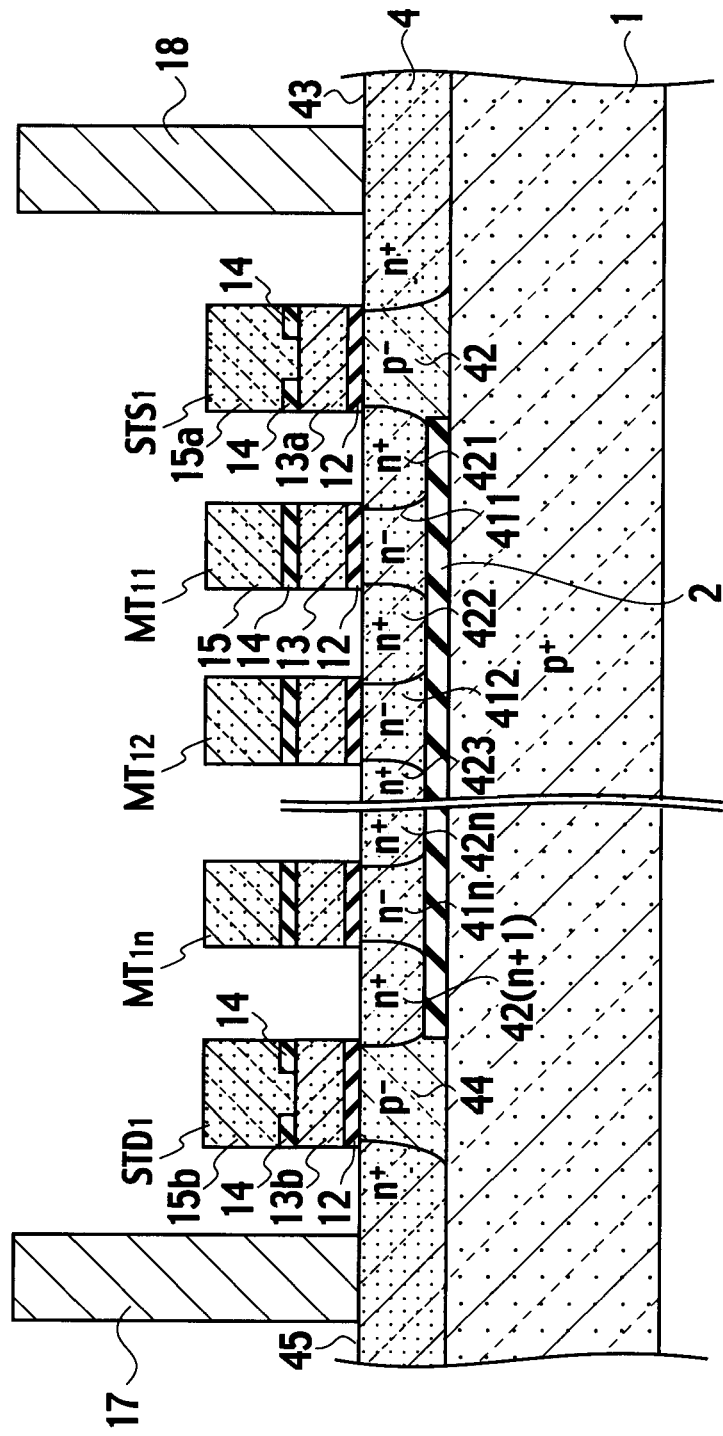

Note that, as shown in FIG. 33, in the case where only the single-layer first buried insulating film 2 is provided, the first buried insulating film 2 is selectively provided under the arrangement of the memory cell transistors MT$_{11}$ to MT$_{1n}$, and the memory cell transistors MT$_{11}$ to MT$_{1n}$ may be formed in the partial SOI region.

(Fourth Modification)

In the embodiment, a stacked gate structure of the floating gate electrode 13 and the control gate electrode 15 has been explained, as shown in FIG. 1. However, it is possible to adapt a Metal-Oxide-Nitride-Oxide-Silicon (MONOS) structure.

Figure 34:
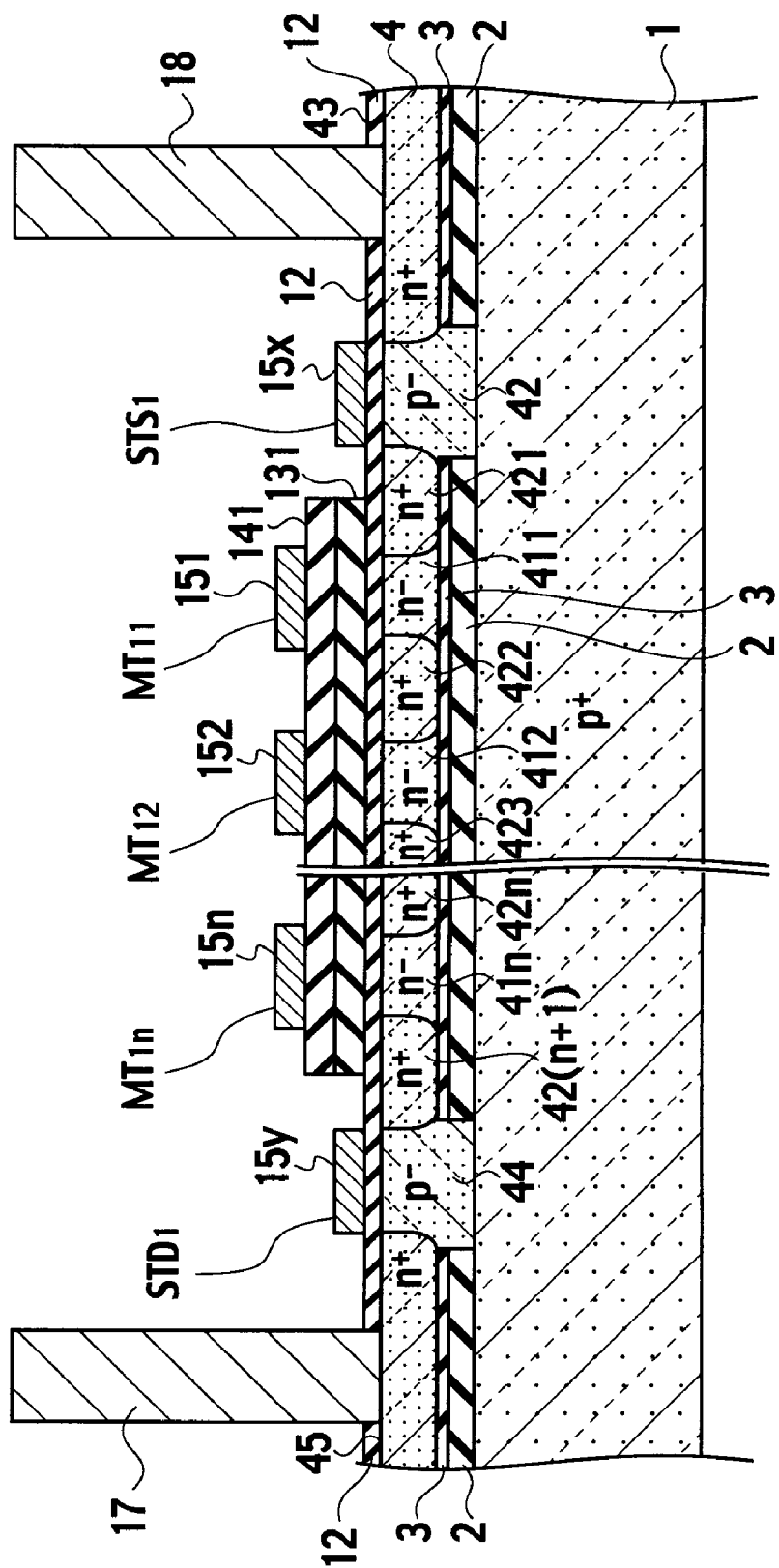
FIG. 34 is a cross-sectional view in the column direction showing an example of a semiconductor memory according to a fourth modification.

As shown in FIG. 34, a semiconductor memory according to a fourth modification includes memory cell transistors MT$_{11}$ to MT$_{1n}$ having MONOS structures. Each of the memory cell transistors MT$_{11}$ to MT$_{1n}$ includes a tunnel oxide film (first insulating film) 12, a nitride film (electric charge storage layer) 131, an oxide film (second insulating film) 141 and gate electrodes 151 to 15$n$. Electrons are trapped by trappes in the nitride film 131 in write operation. On the other hand, each of the select gate transistors STS$_1$ and STD$_1$ includes single gate electrodes 15$x$ and 15$y$, respectively.

With regard to an example of a method for manufacturing the semiconductor memory according to the fourth modification, after forming the tunnel oxide film 12 by thermal oxidation, the nitride film 131 and the oxide film 141 may be deposited on the tunnel oxide film 12 by CVD or the like. Since other steps in the procedure are substantially the same as those in FIGS. 8A to 27B, a redundant description thereof will be omitted.

(Fifth Modification)

Figure 35:
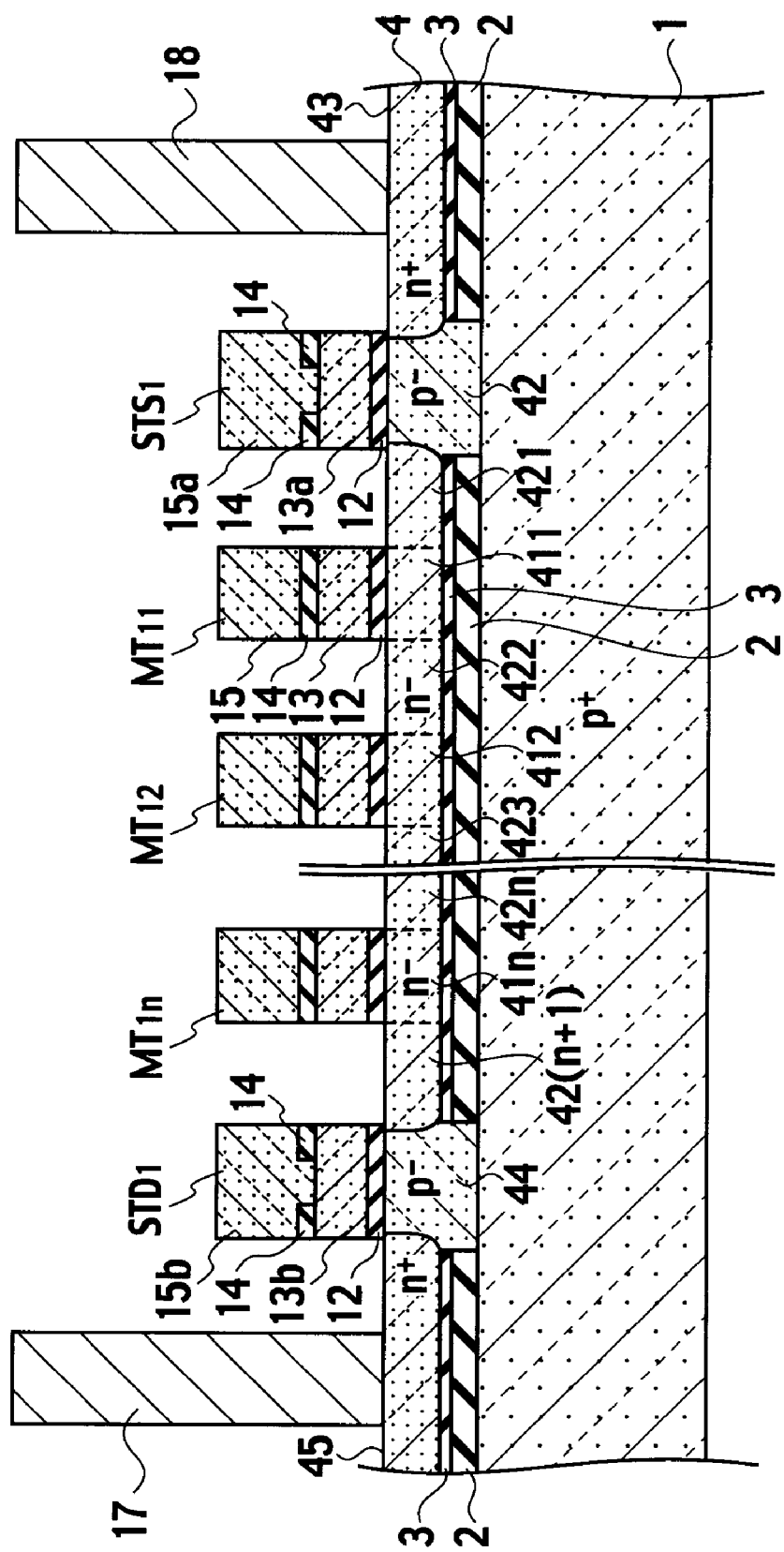
FIG. 35 is a cross-sectional view in the column direction showing an example of a semiconductor memory according to a fifth modification of the embodiment of the present invention.
Figure 36:
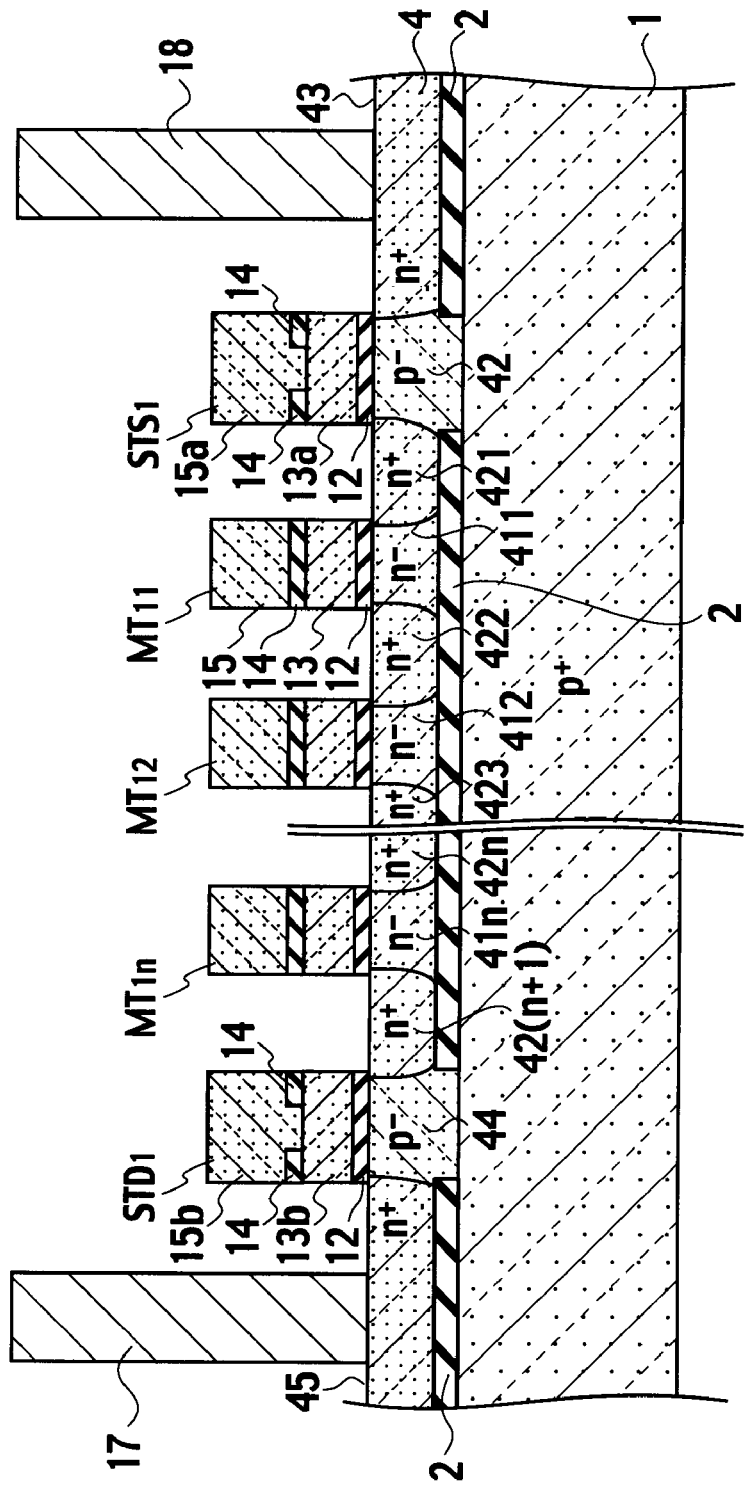
FIG. 36 is a cross-sectional view in the column direction showing an example of a semiconductor memory according to other embodiment of the present invention.

In a semiconductor memory according to a fifth modification, as shown in FIG. 35, the source regions and drain regions 42$_1$ to 42$(n+1)$ may be n$^-$-type with an impurity concentration substantially equivalent to that of the n$^-$-type channel regions 41$_1$ to 41$n$ of the memory cell transistors MT$_{11}$ to MT$_{1n}$. Also in this case, in a similar way to the embodiments of the present invention, the memory cell transistors MT$_{11}$ to MT$_{1n}$ have the source and drain regions 42$_1$ to 42$(n+1)$ and the channel regions 41$_1$ to 41$n$ of the same conductivity type.

With regard to an example of a method for manufacturing the semiconductor memory according to the fifth modification, the ion implantation process of FIGS. 24A and 24B and the thermal treatment process of FIGS. 25A and 25B is omitted. Therefore, the process can be simplified as compared with the semiconductor memory shown in FIG. 1, and this modification is suitable also for miniaturization of the semiconductor memory. Since other steps in the procedure are substantially the same as those in FIGS. 8A to 27B, a redundant description thereof will be omitted.

OTHER EMBODIMENT

Various modifications will become possible for those skilled in the art after receiving the teachings of the present disclosure without departing from the scope thereof.

In the embodiment, m×n memory cell transistors $MT_1$, to $MT_{1n}$, $MT_{21}$ to $MT_{2n}$, ..., $MT_{m1}$ to $MT_{mn}$ have been explained. However, actually, a cell array may be comprised by a plurality of memory cell transistors, memory cells and blocks.

Furthermore, a NAND flash memory employing a partial SOI substrate has been explained. However, a method of forming a partial SOI substrate according to the embodiment of the present invention may be applied to a method for manufacturing a nonvolatile semiconductor memory such as a AND flash memory, DINOR flash memory and the like. Furthermore, the method may be applied to various methods for manufacturing semiconductor memories such as a thin film transistor (TFT), DRAM, SRAM or the like.

Furthermore, the back gate control in reading operation has been explained. However, the back gate control may not be performed in some cases. When a part of the semiconductor substrate 1 under the first buried insulating film 2 includes p-type conductivity, and the semiconductor layer (SOI layer) 4 includes n-type conductivity, a part of the semiconductor layer 4 neighboring the second buried insulating film 3 is depleted by vending of a potential through the first buried insulating film 2 and the second buried insulating film 3. Therefore, it is possible to improve turn-off characteristics. As the thicknesses of the first buried insulating film 2 and the second buried insulating film 3 is increased, turn-off characteristics are not improved so much. For this reason, it is possible to obtain the effectiveness similar to performing of the back gate control.

Furthermore, as shown in FIGS. 11A and 11B, CMP process for planalizing the second semiconductor layer 4 has been explained. However, it is possible to improve step coverage of the first semiconductor layer 40 by narrowing widths of the window portions 21a and 21b shown in FIGS. 9A and 9B. Therefore, it is possible to suppress the step difference of the first semiconductor layer 40.

Furthermore, as shown in FIG. 35, the first buried insulating film 2 may be provided under the bit line contact plugs 17 and the source line contact plug 18.

What is claimed is:

1. A semiconductor memory comprising:
    a plurality of cell units arranged in a row direction, each of the cell units comprising:
        a semiconductor region;
        a first buried insulating film provided on the semiconductor region;
        a second buried insulating film provided on the first buried insulating film, which has higher dielectric constant than the first buried insulating film;
        a semiconductor layer provided on the second buried insulating film; and
        a plurality of memory cell transistors arranged in a column direction, each of the memory cell transistors having a source region, a drain region and a channel region defined in the semiconductor layer,
    wherein each of the cell units further comprises a select gate transistor comprising:
        a second drain region defined in the semiconductor layer so as to be shared with the source region of the memory cell transistor positioned at an end of a unit arrangement of the cell unit in the column direction;
        a second channel region defined in the semiconductor layer so as to contact the second drain region; and
        a second source region defined in the semiconductor layer so as to contact the second channel region;
    wherein the first and second buried insulating films are provided directly under the unit arrangement and the second source and drain regions of the select gate transistor, selectively.

2. The memory of claim 1, wherein the second buried insulating film contains one of silicon nitride, silicon oxide nitride and alumina.

3. The memory of claim 1, wherein the first buried insulating film contains silicon oxide.

4. The memory of claim 1, wherein the second channel region of the select gate transistor contacts the semiconductor region.

5. The memory of claim 1, wherein the second buried insulating film has stronger mechanical strength than the first buried insulating film.

6. The memory of claim 1, wherein the first buried insulating film has a higher dielectric constant than silicon oxide.

* * * * *